United States Patent
Hirai et al.

(10) Patent No.: US 9,139,687 B2
(45) Date of Patent: Sep. 22, 2015

(54) SOLUBLE IMIDE SKELETON RESIN, SOLUBLE IMIDE SKELETON RESIN SOLUTION COMPOSITION, CURABLE RESIN COMPOSITION, AND CURED PRODUCT THEREOF

(75) Inventors: Takayoshi Hirai, Yokkaichi (JP); Tetsurou Imura, Tokyo (JP); Makoto Takahashi, Yokkaichi (JP)

(73) Assignee: Mitsubishi Chemical Corporation, Tokyo (JP)

( * ) Notice: Subject to any disclaimer, the term of this patent is extended or adjusted under 35 U.S.C. 154(b) by 406 days.

(21) Appl. No.: 13/063,587

(22) PCT Filed: Aug. 27, 2009

(86) PCT No.: PCT/JP2009/064949
§ 371 (c)(1), (2), (4) Date: Mar. 11, 2011

(87) PCT Pub. No.: WO2010/029855
PCT Pub. Date: Mar. 18, 2010

(65) Prior Publication Data
US 2012/0043508 A1 Feb. 23, 2012

(30) Foreign Application Priority Data

Sep. 11, 2008 (JP) .................................. 2008-233543
Aug. 5, 2009 (JP) .................................. 2009-182613

(51) Int. Cl.
*H01B 1/22* (2006.01)
*C08L 79/08* (2006.01)
(Continued)

(52) U.S. Cl.
CPC . *C08G 59/22* (2013.01); *B32B 7/12* (2013.01); *B32B 15/20* (2013.01); *C08G 59/066* (2013.01);
(Continued)

(58) Field of Classification Search
USPC ......................................... 528/322, 353, 112
See application file for complete search history.

(56) References Cited

U.S. PATENT DOCUMENTS 4,786,668 A * 11/1988 Dewhirst ...................... 523/445
5,145,942 A * 9/1992 Hergenrother et al. ....... 528/353
(Continued)

FOREIGN PATENT DOCUMENTS

| CN | 1978488 A | 6/2007 |
| JP | 51-131526 | 11/1976 |

(Continued)

OTHER PUBLICATIONS

International Search Report issued Nov. 17, 2009 in PCT/JP09/064949 filed Aug. 27, 2009.
(Continued)

*Primary Examiner* — Rachel Kahn
(74) *Attorney, Agent, or Firm* — Oblon, McClelland, Maier & Neustadt, L.L.P.

(57) ABSTRACT

An imide skeleton resin represented by the following general formula (1) has a coefficient of linear expansion as low as that of polyimide resin and excellent processability like epoxy resin, and is useful as a resin composition for electrical laminates. Five percent by mole or more of the entirety of the A component is a linking group having an imide skeleton represented by the following general formula (4-1). B denotes a hydrogen atom or a group represented by the following structural formula (5). n denotes an integer in the range of 0 to 200. If both of the B's are hydrogen atoms, then n denotes an integer of 1 or more.

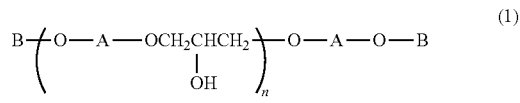

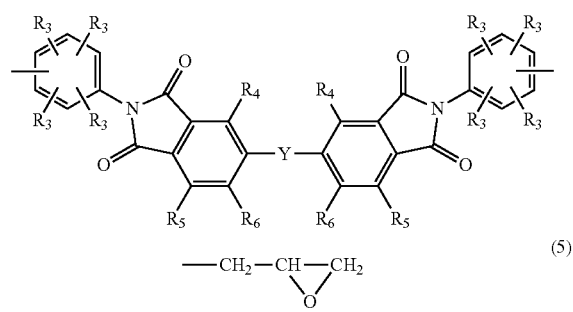

11 Claims, 4 Drawing Sheets

(51) Int. Cl.

| | | |
|---|---|---|
| *C08G 73/10* | (2006.01) | |
| *C08G 59/22* | (2006.01) | |
| *B32B 7/12* | (2006.01) | |
| *B32B 15/20* | (2006.01) | |
| *C08G 59/62* | (2006.01) | |
| *C08G 59/68* | (2006.01) | |
| *C08L 63/00* | (2006.01) | |
| *C08G 59/06* | (2006.01) | |
| *C08G 59/26* | (2006.01) | |
| *H05K 1/03* | (2006.01) | |
| *H05K 3/46* | (2006.01) | |

(52) U.S. Cl.
CPC .............. *C08G 59/26* (2013.01); *C08G 59/621* (2013.01); *C08G 59/686* (2013.01); *C08G 73/10* (2013.01); *C08G 73/105* (2013.01); *C08G 73/1039* (2013.01); *C08G 73/1064* (2013.01); *C08G 73/1067* (2013.01); *C08G 73/1071* (2013.01); *C08L 63/00* (2013.01); *C08L 79/08* (2013.01); *H05K 1/0353* (2013.01); *H05K 3/4626* (2013.01)

(56) References Cited

U.S. PATENT DOCUMENTS

| | | |
|---|---|---|
| 5,246,751 A | 9/1993 | White et al. |
| 6,436,593 B1 | 8/2002 | Minegishi et al. |

FOREIGN PATENT DOCUMENTS

| | | |
|---|---|---|
| JP | 62 145063 | 6/1987 |
| JP | 62 292822 | 12/1987 |
| JP | 3 275669 | 12/1991 |
| JP | 4 33925 | 2/1992 |
| JP | 4 62522 | 2/1992 |
| JP | 4 62991 | 2/1992 |
| JP | 2003 252951 | 9/2003 |
| JP | 2003 342350 | 12/2003 |
| JP | 2003342350 A * | 12/2003 |

OTHER PUBLICATIONS

Combined Chinese Office Action and Search Report Issued Oct. 30, 2012 in Patent Application No. 200980136094.2 (with English translation).

Virginia Cádiz et al., "Preparation of prepolymers from diglycidylether of Bisphenol A containing imide groups", Die Angewandte Makromolekulare Chemie, vol. 195, 1992, pp. 129-137.

Chinese Office Action Issued Jun. 19, 2013 in Patent Application No. 200980136094.2 (with English translation).

Office Action and Search Report issued on Jan. 22, 2014 in the corresponding Taiwanese Application No. 098130558 (with English Translation).

Office Action issued Feb. 12, 2014 in Japanese Patent Application No. 2009-182613 (with English language translation).

\* cited by examiner

IR CHART OF EXAMPLE 6

TMA CHART OF PARTICULAR CURED PRODUCT OF EXAMPLE 6

SOLUBLE IMIDE SKELETON RESIN, SOLUBLE IMIDE SKELETON RESIN SOLUTION COMPOSITION, CURABLE RESIN COMPOSITION, AND CURED PRODUCT THEREOF

FIELD OF INVENTION

The present invention relates to a resin containing an imide skeleton structure as an essential component, a resin solution composition containing the resin, a curable resin composition containing the resin, a cured product thereof, and a laminated product containing the cured product.

A soluble imide skeleton resin according to the present invention can provide a curable resin composition that is suitable for use as a constituent material of an electrical laminate, such as a printed wiring board, having a high glass transition temperature and a low thermal expansion coefficient. The term "electrical laminate", as used herein, refers to a laminate for use in insulating substrates, including printed wiring boards, build-up laminates, flexible laminates, resist materials, and sealing materials.

BACKGROUND ART

Epoxy resin has high heat resistance, excellent adhesive properties, high water resistance, high mechanical strength, and excellent electrical characteristics and is therefore used in various fields, such as adhesives, paints, civil engineering and construction materials, and insulating materials for electrical and electronic components. In particular, in electrical and electronic fields, epoxy resin is widely used in insulating casting, laminated materials, sealing materials, and the like.

In printed wiring boards for use in electrical and electronic devices, particularly multilayer printed wiring boards, with recent reductions in the size and weight and increases in the functionality of devices, there are demands for further increases in the number of layers and packaging density, reductions in thickness and weight, and improvements in reliability and molding processability.

Thus, as wiring becomes finer, among the characteristics of resins serving as substrate materials, there are particular demands for further improvement in heat resistance and reduction in the coefficient of linear expansion.

At present, one of low linear expansion thermosetting resins is polyimide resin. Polyimide resin is the mainstream in the field of flexible printed wiring boards. However, polyimide resin is difficult to process because of its high heat resistance. Furthermore, polyimide resin is very difficult to handle during processing because polyimide resin dissolves only in particular polar solvents. Thus, polyimide resin has various limitations. For example, hitherto known imide skeleton compounds have insufficient solubility in common organic solvents, such as ketone solvents, and dissolve only in polar solvents, such as dimethylformamide and N-methylpyrrolidone (Patent Literature 1).

In contrast, epoxy resin has better processability and higher solubility in solvents than polyimide resin. However, epoxy resin is unsatisfactory with respect to the coefficient of linear expansion.

Although an anthracene skeleton epoxy resin, a bisphenol S skeleton epoxy resin, and a naphthalene skeleton epoxy resin are conventionally known as epoxy resins having a low coefficient of linear expansion, these resins have still higher coefficients of linear expansion than polyimide resin.

Patent Literatures 2 and 3 describe imide skeleton epoxy resins that are structurally different from a soluble imide skeleton resin according to the present invention.

Patent Literature 1 relates to a thermoplastic polymer produced by the reaction between imidophenol and an epoxy resin. This thermoplastic polymer dissolves in polar solvents, such as dimethylformamide and N-methylpyrrolidone, but does not dissolve in ketone solvents. Patent Literature 4 also describes a composition produced by the reaction between imidophenol and an epoxy resin. This resin has low solubility in a polar solvent N-methylpyrrolidone, and it goes without saying that the resin does not dissolve in ketone solvents.

CITATION LIST

Patent Literature

PTL 1: U.S. Pat. No. 5,246,751
PTL 2: Japanese Unexamined Patent Application Publication No. 4-62522
PTL 3: Japanese Unexamined Patent Application Publication No. 4-62991
PTL 4: Japanese Unexamined Patent Application Publication No. 62-292822

OBJECT AND SUMMARY OF INVENTION

When existing epoxy resins are used in resin compositions for electrical laminates, a coefficient of linear expansion as low as that of polyimide resin cannot be achieved. On the other hand, polyimide resin has low solubility in common organic solvents and consequently insufficient processability.

Accordingly, it is an object of the present invention to provide a soluble imide skeleton resin that has a coefficient of linear expansion as low as that of polyimide resin, excellent processability like epoxy resin, and sufficient solubility in common ketone solvents and that is useful for resin compositions for use in electrical laminates.

It is another object of the present invention to provide a soluble imide skeleton resin solution composition and a curable resin composition each containing the imide skeleton resin, a cured product thereof, and a laminated product containing the cured product.

The present invention includes the following embodiments.

[1] A soluble imide skeleton resin that is represented by the following general formula (1) and has a solubility of 1% by weight or more in cyclohexanone at 60° C.

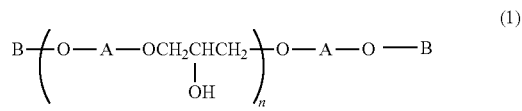

(1)

In the Formula (1), A denotes a linking group represented by the following general formula (2-1), (3-1), or (4-1), and the (n+1) A's may be the same or different, provided that 5% by mole or more of the entirety of the A component is a linking group having an imide skeleton represented by the following general formula (4-1), B denotes a hydrogen atom or a group represented by the following structural formula (5), and the two B's may be the same or different, and n denotes an integer in the range of 0 to 200, provided that n denotes an integer of 1 or more when both of the B's are hydrogen atoms.

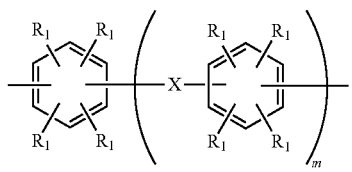
(2-1)

In the formula (2-1), $R_1$ denotes a hydrogen atom, a hydrocarbon group containing 1 to 10 carbon atoms, or a halogen element, a plurality of $R_1$'s may be the same or different, and two $R_1$'s bonded to adjacent carbon atoms on a benzene ring may be bound together to form a cyclic group containing 4 to 20 carbon atoms and the cyclic group may include aromatic ring(s), m is 0 or 1, and X denotes a single bond, a divalent hydrocarbon group containing 1 to 20 carbon atoms, —O—, —S—, —SO$_2$—, or CO—.

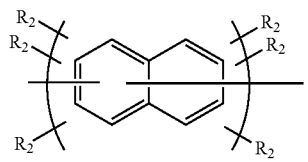
(3-1)

In the formula (3-1), $R_2$ denotes a hydrogen atom, a hydrocarbon group containing 1 to 10 carbon atoms, or a halogen element, a plurality of $R_2$'s may be the same or different, and two $R_2$'s bonded to adjacent carbon atoms on the naphthalene ring may be bound together to form a cyclic group containing 4 to 20 carbon atoms and the cyclic group may include aromatic ring(s).

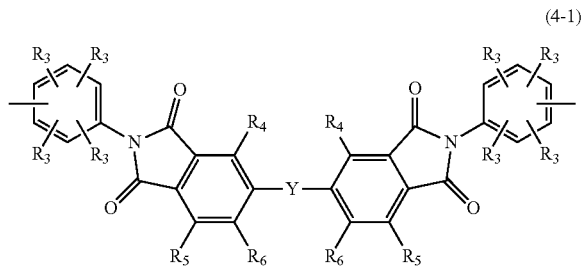
(4-1)

In the formula (4-1), $R_3$ denotes a hydrogen atom, a hydrocarbon group containing 1 to 10 carbon atoms, or a halogen element, a plurality of $R_3$'s may be the same or different, and two $R_3$'s bonded to adjacent carbon atoms on a benzene ring may be bound together to form a cyclic group containing 4 to 20 carbon atoms and the cyclic group may include aromatic ring(s), $R_4$, $R_5$, and $R_6$ independently denote a hydrogen atom, a phenyl group, or a hydrocarbon group containing 1 to 10 carbon atoms, two $R_4$'s may be the same or different, two $R_5$'s may be the same or different, and two $R_6$'s may be the same or different, and $R_5$ and $R_6$ bonded to adjacent carbon atoms on a benzene ring may be bound together to form a cyclic group containing 4 to 20 carbon atoms and the cyclic group may include aromatic ring(s), and Y denotes a group selected from a single bond, —SO$_2$—, —O—, —CO—, —C(CF$_3$)$_2$—, —S—, or a divalent hydrocarbon group containing 1 to 20 carbon atoms.

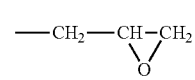
(5)

[2] The soluble imide skeleton resin according to [1], wherein a linking group having an imide skeleton represented by the general formula (4-1) is represented by the following general formula (6-1).

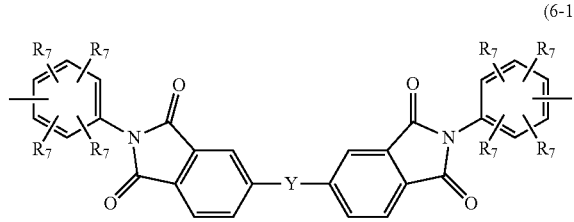
(6-1)

In the formula (6-1), $R_7$ denotes a hydrogen atom, a hydrocarbon group containing 1 to 10 carbon atoms, or a halogen element, a plurality of $R_7$'s may be the same or different, and two $R_7$'s bonded to adjacent carbon atoms on a benzene ring may be bound together to form a cyclic group containing 4 to 20 carbon atoms and the cyclic group may include aromatic ring(s), and Y denotes the same as in the general formula (4-1).

[3] The soluble imide skeleton resin according to [1] or [2], wherein a cured product formed by the soluble imide skeleton resin being blended only with a curing agent and a curing accelerator has a glass transition temperature of 130° C. or more and a coefficient of linear expansion at the glass transition temperature or less of less than 75 ppm/° C.

[4] A soluble imide skeleton resin that has an epoxy group(s) and an imide group(s) and has a solubility of 1% by weight or more in cyclohexanone at 60° C., wherein a cured product formed by the soluble imide skeleton resin being blended only with a curing agent and a curing accelerator has a glass transition temperature of 130° C. or more and a coefficient of linear expansion at the glass transition temperature or less of less than 75 ppm/° C.

[5] The soluble imide skeleton resin according to [4], wherein the imide group is a substituted or unsubstituted phthalimide group.

[6] The soluble imide skeleton resin according to [4] or [5], wherein the imide skeleton resin has an imide group(s) and a hydroxyethylene group(s) on the main chain.

[7] A method for producing a soluble imide skeleton resin according to any one of [1] to [3], comprising reacting a divalent phenol compound represented by any of the following general formulae (2-2), (3-2), and (4-2) with epihalohydrin in the presence of an alkaline.

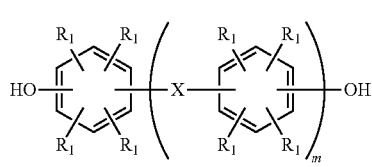
(2-2)

In the formula (2-2), $R_1$, X, and m denote the same as in the general formula (2-1).

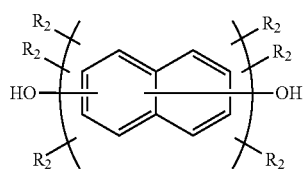
(3-2)

In the formula (3-2), $R_2$ denotes the same as in the general formula (3-1).

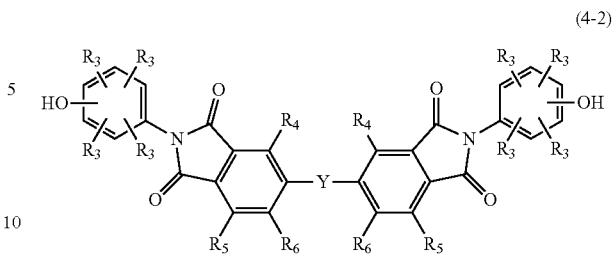
(4-2)

In the formula (4-2), $R_3$, $R_4$, $R_5$, $R_6$, and Y denote the same as in the general formula (4-1).

[8] A method for producing a soluble imide skeleton resin according to any one of [1] to [3], comprising reacting a bifunctional epoxy resin represented by any of the following general formulae (7), (8), and (9) with a divalent phenol compound represented by any of the following general formulae (2-2), (3-2), and (4-2) in the presence of a catalyst(s).

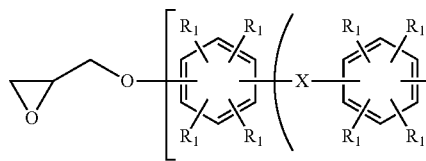
(7)

In the formula (7), $R_1$ and X denote the same as in the general formula (2-1), l is 0 or 1, and p denotes an integer in the range of 0 to 10.

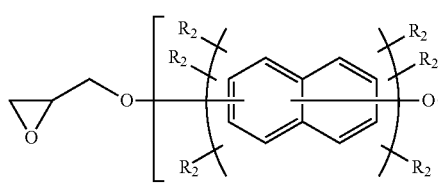
(8)

In the formula (8), $R_2$ denotes the same as in the general formula (3-1), and q denotes an integer in the range of 0 to 10.

(9)

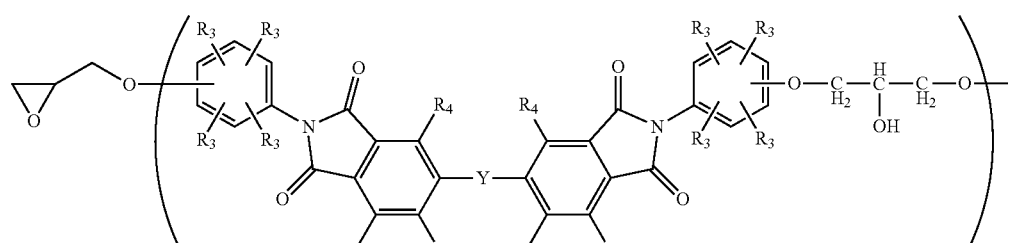

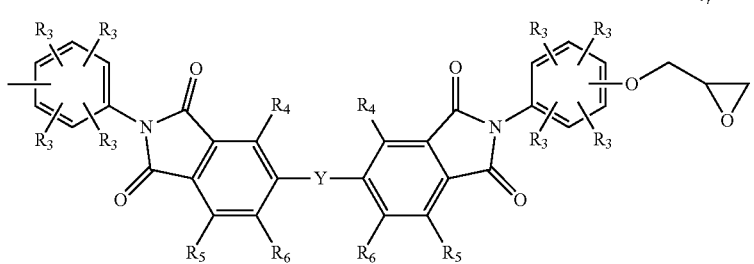

In the formula (9), $R_3$, $R_4$, $R_5$, $R_6$, and Y denote the same as in the general formula (4-1), and r denotes an integer in the range of 0 to 10.

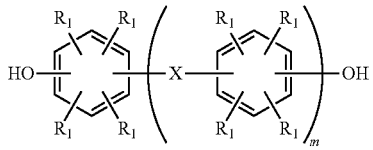
(2-2)

In the formula (2-2), $R_1$, X, and m denote the same as in the general formula (2-1).

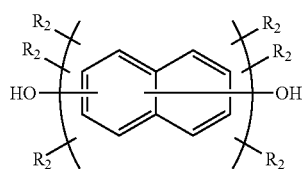
(3-2)

In the formula (3-2), $R_2$ denotes the same as in the general formula (3-1).

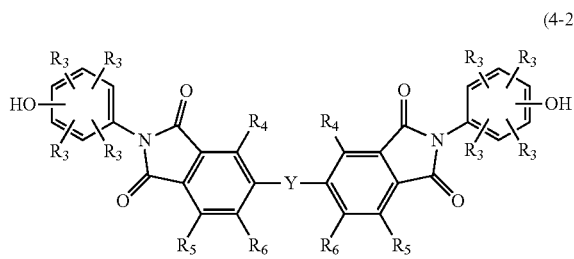
(4-2)

In the formula (4-2), $R_3$, $R_4$, $R_5$, $R_6$, and Y denote the same as in the general formula (4-1).

[9] A soluble imide skeleton resin solution composition, comprising 1% to 90% by weight of a soluble imide skeleton resin according to any one of [1] to [6] dissolved in a solvent containing a ketone solvent and/or dimethylacetamide, the ketone solvent and/or dimethylacetamide accounting for 10% by weight or more of the entirety of the solvent components.

[10] A curable resin composition, comprising an imide skeleton resin according to any one of [1] to [6].

[11] The curable resin composition according to [10], further comprising a curing agent and a curing accelerator.

[12] The curable resin composition according to [10] or [11], further comprising one or two or more selected from the group consisting of epoxy resins other than the imide skeleton resin, thermosetting resins other than epoxy resins, and inorganic filler.

[13] The curable resin composition according to any one of [10] to [12], wherein the curable resin composition is used in a printed wiring board.

[14] A cured resin, produced by curing a curable resin composition according to any one of [10] to [13].

[15] A laminated product, comprising a cured resin according to [14] and a conducting metal.

Advantageous Effects of Invention

A soluble imide skeleton resin according to the present invention has high solubility in various solvents. This soluble imide skeleton resin and a curable resin composition containing the soluble imide skeleton resin have a low coefficient of linear expansion, high heat resistance (glass transition temperature), and excellent processability, and are particularly useful for electrical laminate applications that require a low coefficient of linear expansion.

The present invention provides a cured resin useful for electrical laminates, particularly printed wiring boards, and a laminated product.

DESCRIPTION OF EMBODIMENTS

Figure 1:
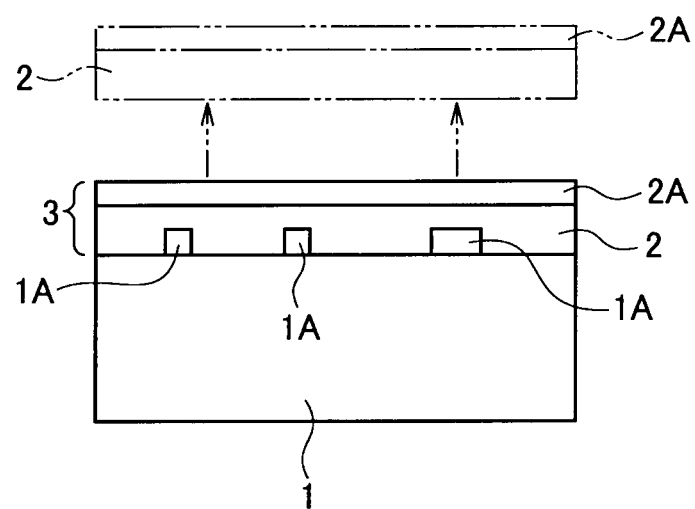
FIG. 1 is an explanatory drawing of a build-up process.

Embodiments of the present invention will be described below in detail.

[Soluble Imide Skeleton Resin]

A soluble imide skeleton resin according to a first embodiment of the present invention is represented by the following general formula (1) and has a solubility of 1% by weight or more in cyclohexanone at 60° C.

A soluble imide skeleton resin according to a second embodiment of the present invention is an imide skeleton resin having an epoxy group and an imide group and has a solubility of 1% by weight or more in cyclohexanone at 60° C. (this solubility is hereinafter also referred to as "cyclohexanone solubility"), wherein a cured product formed by the soluble imide skeleton resin being blended only with a curing agent and a curing accelerator has a glass transition temperature of 130° C. or more and a coefficient of linear expansion at the glass transition temperature or less of less than 75 ppm/° C.

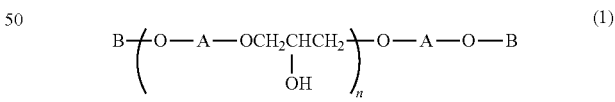
(1)

In the formula (1), A denotes a linking group represented by the following general formula (2-1), (3-1), or (4-1), and the (n+1) A's may be the same or different, provided that 5% by mole or more of the entirety of the A component is a linking group having an imide skeleton represented by the following general formula (4-1), B denotes a hydrogen atom or a group represented by the following structural formula (5), and the two B's may be the same or different, and n denotes an integer in the range of 0 to 200, provided that n denotes an integer of 1 or more when both of the B's are hydrogen atoms.

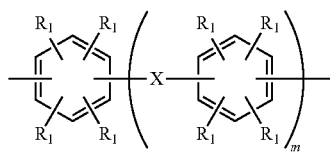

(2-1)

In the formula (2-1), $R_1$ denotes a hydrogen atom, a hydrocarbon group containing 1 to 10 carbon atoms, or a halogen element, a plurality of $R_1$'s may be the same or different, and two $R_1$'s bonded to adjacent carbon atoms on a benzene ring may be bound together to form a cyclic group containing 4 to 20 carbon atoms and the cyclic group may include aromatic ring(s), m is 0 or 1, and X denotes a single bond, a divalent hydrocarbon group containing 1 to 20 carbon atoms, —O—, —S—, —$SO_2$—, or CO—.

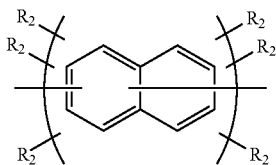

(3-1)

In the formula (3-1), $R_2$ denotes a hydrogen atom, a hydrocarbon group containing 1 to 10 carbon atoms, or a halogen element, a plurality of $R_2$'s may be the same or different, and two $R_2$'s bonded to adjacent carbon atoms on the naphthalene ring may be bound together to form a cyclic group containing 4 to 20 carbon atoms and the cyclic group may include aromatic ring(s).

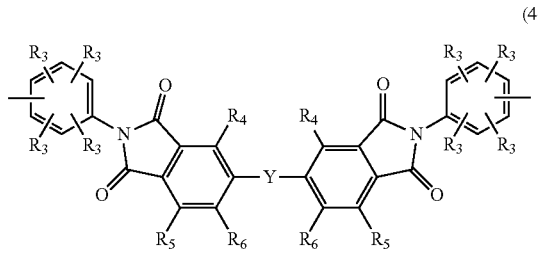

(4-1)

In the formula (4-1), $R_3$ denotes a hydrogen atom, a hydrocarbon group containing 1 to 10 carbon atoms, or a halogen element, a plurality of $R_3$'s may be the same or different, and two $R_3$'s bonded to adjacent carbon atoms on a benzene ring may be bound together to form a cyclic group containing 4 to 20 carbon atoms and the cyclic group may include aromatic ring(s), $R_4$, $R_5$, and $R_6$ independently denote a hydrogen atom, a phenyl group, or a hydrocarbon group containing 1 to 10 carbon atoms, two $R_4$'s may be the same or different, two $R_5$'s may be the same or different, and two $R_6$'s may be the same or different, $R_5$ and $R_6$ bonded to adjacent carbon atoms on a benzene ring may be bound together to form a cyclic group having an aromatic ring containing 4 to 20 carbon atoms, and Y denotes a group selected from a single bond, —$SO_2^-$, —O—, —CO—, —$C(CF_3)_2$—, —S—, or a divalent hydrocarbon group containing 1 to 20 carbon atoms.

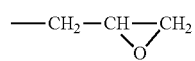

(5)

[Soluble Imide Skeleton Resin According to First Embodiment]

<A Component>

In the general formula (1) representing the soluble imide skeleton resin according to the first embodiment, A denotes a linking group represented by the general formula (2-1), the general formula (3-1), or the general formula (4-1). In the general formula (2-1), $R_1$ preferably denotes a hydrogen atom or a methyl group, and X preferably denotes a single bond or a methylene group or propylene group, optionally substituted with an alkyl group containing 1 to 6 carbon atoms.

Particularly preferably, the linking group represented by the general formula (2-1) may be a linking group represented by the following structural formula (2-3), (2-4), or (2-5). Particularly preferably, the linking group represented by the structural formula (2-5) is a linking group represented by the following structural formula (2-5a).

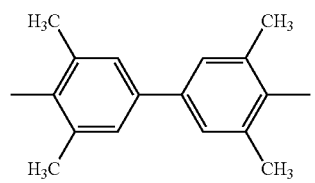

(2-3)

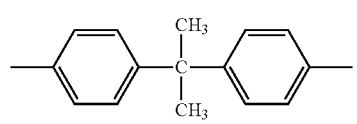

(2-4)

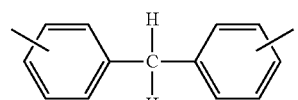

(2-5)

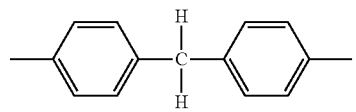

(2-5a)

In the general formula (3-1), $R_2$ preferably denotes a hydrogen atom, a methyl group, or a cyclic group that contains four carbon atoms and that is bonded to adjacent carbon atoms on the naphthalene ring. Particularly preferably, the linking group represented by the general formula (3-1) may be a linking group represented by the following structural formula (3-2) or (3-3).

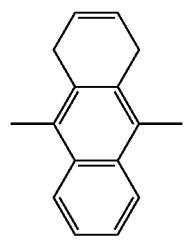

(3-3)

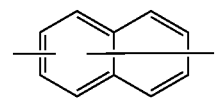

(3-4)

In the general formula (4-1), $R_3$ preferably denotes a hydrogen atom or a methyl group. In the case that $R_3$ denotes a hydrogen atom, the bonding site of the hydrogen atom is preferably a meta position and/or a para position relative to the bonding site of an imide group on the benzene ring. In the case that $R_3$ denotes a methyl group, principally in terms of solubility, the bonding site of the methyl group is preferably an ortho position and/or a meta position relative to the bonding site of an imide group on the benzene ring.

Preferably, $R_4$, $R_5$, and $R_6$ independently denote a hydrogen atom or a methyl group.

Preferably, Y denotes a single bond, —$SO_2$—, —O—, —CO—, or $C(CF_3)_2$—.

In particular, a linking group having an imide skeleton represented by the general formula (4-1) is preferably represented by the following general formula (6-1), wherein $R_7$ preferably denotes a hydrogen atom or a methyl group, and the bonding site of the hydrogen atom or the methyl group is preferably a meta position and/or a para position relative to the bonding site of an imide group on the benzene ring.

Particularly preferably, the linking group represented by the general formula (6-1) is a linking group represented by the following general formula (10-1).

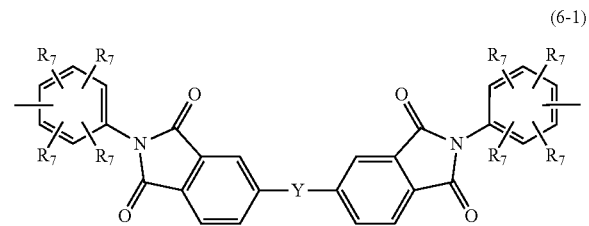

(6-1)

In the formula (6-1), $R_7$ denotes a hydrogen atom, a hydrocarbon group containing 1 to 10 carbon atoms, or a halogen element, a plurality of $R_7$'s may be the same or different, and two $R_7$'s bonded to adjacent carbon atoms on a benzene ring may be bound together to form a cyclic group containing 4 to 20 carbon atoms and the cyclic group may include aromatic ring(s), and Y denotes the same as in the general formula (4-1).

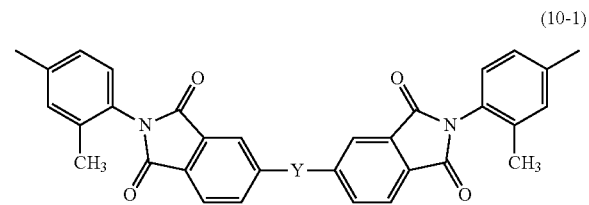

(10-1)

In the formula (10-1), Y preferably denotes a single bond, —$SO_2$—, —O—, —CO—, or $C(CF_2)_2$—.

<Imide Skeleton Molar Content of A>

The A component of the soluble imide skeleton resin represented by the general formula (1) according to the first embodiment is the linking group represented by the general formula (2-1), (3-1), or (4-1). The proportion of a linking group having an imide skeleton represented by the general formula (4-1) in the entirety of the A component of the general formula (1) (this proportion is hereinafter also referred to as "the imide skeleton molar content of A") is 5% by mole or more, preferably 10% by mole or more, more preferably 15% by mole or more.

An imide skeleton molar content of A below 5% by mole results in an insufficient coefficient of linear expansion and insufficient heat resistance.

Although the upper limit of the imide skeleton molar content of A is 100% by mole, a high imide skeleton content results in poor solubility. Thus, the upper limit of the imide skeleton molar content of A is preferably 95% by mole or less, more preferably 90% by mole or less.

<B Component>

B in the general formula (1) denotes a hydrogen atom or a group represented by the following structural formula (5), and the two B's may be the same or different.

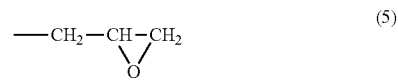

(5)

In the general formula (1), the proportion of the group represented by the structural formula (5) in the entirety of the B component is not particularly limited and may be higher or lower than the proportion of a hydrogen atom. The entirety of the B component may be a hydrogen atom or the group represented by the structural formula (5).

A soluble imide skeleton resin in which both of the B's are hydrogen atoms or a soluble imide skeleton resin containing a high proportion of a hydrogen atom can be used as a phenolic curing agent.

A soluble imide skeleton resin in which both of the B's are the groups represented by the structural formula (5) or a soluble imide skeleton resin containing a high proportion of the group represented by the structural formula (5) can be used as epoxy resin. In this case, the epoxy equivalent weight is preferably 190 g/eq. or more. The upper limit of the epoxy equivalent weight is not particularly limited but generally 100,000 g/eq. or less.

When the soluble imide skeleton resin according to the first embodiment is used as a phenolic curing agent, the proportion of a hydrogen atom in the entirety of the B component is, for example, 50% to 100% by mole, preferably 70% to 100% by mole, more preferably 90% to 100% by mole. When a soluble imide skeleton resin according to the present invention is used as epoxy resin, the proportion of the group represented by the structural formula (5) in the entirety of the B component is, for example, 50% to 100% by mole, preferably 70% to 100% by mole, more preferably 90% to 100% by mole.

[Soluble Imide Skeleton Resin According to Second Embodiment]

<Imide Group>

The imide group of the soluble imide skeleton resin according to the second embodiment refers to a residue derived from an imide, wherein the imide refers to a cyclic compound having —CONHCO—.

Examples of the imide group of the soluble imide skeleton resin include a phthalimide group, a succinimide group, a maleimide group, and these imide groups substituted with a substituent, such as a phenyl group or a hydrocarbon group containing 1 to 10 carbon atoms. Preferably, the imide group of the soluble imide skeleton resin is a phthalimide group substituted with the substituent or an unsubstituted phthalimide group.

The imide group may be present as a divalent organic group on the main chain of the soluble imide skeleton resin or as a monovalent organic group on a side chain provided that the imide group satisfies the cyclohexanone solubility, the glass transition temperature, and the coefficient of linear expansion defined in the second embodiment.

The imide group content of the soluble imide skeleton resin is also not particularly limited provided that the imide group satisfies the cyclohexanone solubility, the glass transition temperature, and the coefficient of linear expansion defined in the second embodiment.

<Epoxy Group>

The epoxy group of the soluble imide skeleton resin according to the second embodiment is preferably a glycidyl group. Thus, the epoxy group is preferably present as part of a glycidyl group.

The epoxy group may be present on an end of the main chain or on a side chain.

The epoxy group content of the soluble imide skeleton resin is not particularly limited provided that the epoxy group satisfies the cyclohexanone solubility, the glass transition temperature, and the coefficient of linear expansion defined in the second embodiment.

<Preferred Structure>

Preferably, the soluble imide skeleton resin according to the second embodiment has the imide group and a hydroxyethylene group on the main chain. The imide group and the hydroxyethylene group may be bonded directly or through a heteroatom, such as oxygen, or another atomic group.

Furthermore, the hydroxyethylene group may be present on the main chain as part of a hydroxypolymethylene group, such as a 2-hydroxytrimethylene group.

{n Value and Number-Average Molecular Weight}

A soluble imide skeleton resin according to the present invention generally has a number-average molecular weight of 300 or more, more preferably 350 or more. A number-average molecular weight above 120,000 unfavorably results in a very high viscosity and poor handling of the resin. In terms of both the heat resistance and the handleability of the resin, a soluble imide skeleton resin according to the present invention preferably has a number-average molecular weight of 100,000 or less, more preferably 80,000 or less.

A soluble imide skeleton resin having such a number-average molecular weight generally has an n value in the range of 0 to 200 in the general formula (1).

A soluble imide skeleton resin having n below 10 can be treated as epoxy or phenolic resin and is easy to handle because of low resin viscosity. A soluble imide skeleton resin having n of 10 or more can be formed into a film and has excellent film formability. Furthermore, a soluble imide skeleton resin having n of 10 or more can be used as thermoplastic resin.

In a soluble imide skeleton resin according to the present invention, in the case that both of the B's in the general formula (1) are hydrogen atoms, n is 1 or more. In the case that both of the B's are hydrogen atoms, n=0 results in strong crystallinity and poor handling.

With respect to the number-average molecular weight of a soluble imide skeleton resin according to the present invention, in a method for producing a soluble imide skeleton resin described below, the molar ratio of epihalohydrin to a divalent phenol compound to be charged or the molar ratio of a bifunctional epoxy resin to a divalent phenol compound to be charged may be controlled to produce an imide skeleton resin having a target value.

The number-average molecular weight and the n values and the mean value thereof of an imide skeleton resin can be determined by the methods described below in the examples.

{Solubility in Ketone Solvent}

A soluble imide skeleton resin according to the present invention has a solubility of 1% by weight or more, preferably 1.5% by weight or more, more preferably 2.0% by weight or more, particularly preferred 2.5% by weight or more, most preferably 3.0% by weight or more, in cyclohexanone at 60° C.

In order for a soluble imide skeleton resin according to the present invention to have such solubility, the following must be controlled: the types, numbers, and positions of $R_3$, $R_4$, $R_5$, $R_6$, and Y of the general formula (4-1), the combination of the general formulae (2-1), (3-1), and (4-1), the proportion of a linking group having an imide skeleton represented by the general formula (4-1) in the general formula (1), the number of n, the type of B, and the like. This control is described above in <A Component>, <Imide Skeleton Molar Content of A>, <B Component>, and <n Value and Number-Average Molecular Weight>.

A method for measuring the solubility of a soluble imide skeleton resin according to the present invention in cyclohexanone is described below.

Method for Measuring Solubility

A sample bottle is charged with an imide skeleton resin and cyclohexanone and is heated in an oil bath at 60° C. for two hours while sometimes being shaken by hand. The solubility is visually observed. The observation is started at a high concentration. When undissolved resin is observed, a small amount of solvent is gradually added to reduce the concentration. The concentration for complete dissolution is taken as solubility.

{Glass Transition Temperature and Coefficient of Linear Expansion of Particular Cured Product}

In a soluble imide skeleton resin according to the present invention, preferably, the glass transition temperature (Tg) of a cured product formed by blending the soluble imide skeleton resin only with a curing agent and a curing accelerator (this cured product is hereinafter also referred to as a "particular cured product") is 130° C. or more, and the coefficient of linear expansion (CTE) at the glass transition temperature or less is less than 75 ppm/° C.

A particular cured product to be subjected to the measurements of the glass transition temperature and the coefficient of linear expansion is produced as specifically described below in accordance with the epoxy equivalent weight of a soluble imide skeleton resin.

Curing Method I: for Soluble Imide Skeleton Resin Having Epoxy Equivalent Weight of 5000 g/eq. or More 100 g (solid) of a soluble imide skeleton resin, 5 g of a curing agent jER 157S70 (trade name of Japan Epoxy Resins Co., Ltd., a bisphenol A novolak epoxy resin, epoxy equivalent weight 210 (g/eq.)), 2 g of jER Cure YLH129 (trade name of Japan Epoxy Resins Co., Ltd., a bisphenol A novolak resin, hydroxyl equivalent weight 117 (g/eq.), softening point 115 (° C.)), 0.5 g of a curing accelerator 2-ethyl-4-methylimidazole, 80 g of cyclohexane, and 80 g of dimethylacetamide are mixed in a 1000-ml beaker. A coating film is formed with an applicator having a slit width of 300 μm on a Teflon film (Nichias Co., Teflon tape TOMBO9001) and is held in a hot-air dryer at 170° C. for 30 minutes and at 200° C. for 90 minutes, forming a particular cured product having a thickness in the range of 60 to 100 μm.

Curing Method II: for Soluble Imide Skeleton Resin Having Epoxy Equivalent below 5000 g/eq.

100 g (solid) of a soluble imide skeleton resin, [(100×117)/(epoxy equivalent of imide skeleton resin)] g of a curing agent jER Cure YLH129 (trade name of Japan Epoxy Resins Co., Ltd., a bisphenol A novolak resin, hydroxyl equivalent 117 (g/eq.), softening point 115 (° C.)), and 0.3 g of a curing accelerator 2-ethyl-4-methylimidazole are placed in a 200-ml beaker, are heated on a hot plate at 260° C., and are melt-blended. After the melt-blended resin is degassed under reduced pressure, the resin is heated in a Safeven dryer at 170° C. for 30 minutes and then 200° C. for 90 minutes to produce a particular cured product.

The glass transition temperature and the coefficient of linear expansion of the particular cured product thus produced are determined by the methods described below in the examples.

When this glass transition temperature is below 130° C., a heat-resistant resin intended by the present invention cannot be produced. The glass transition temperature is preferably 140° C. or more, more preferably 150° C. or more. Although the glass transition temperature is preferably high, the glass transition temperature is generally 250° C. or less.

When the coefficient of linear expansion is 75 ppm/° C. or more, a resin having a low coefficient of linear expansion intended by the present invention cannot be produced. The coefficient of linear expansion is preferably low, more preferably 70 ppm/° C. or more, still more preferably 65 ppm/° C. or less. Although the coefficient of linear expansion is preferably low, the coefficient of linear expansion is generally 30 ppm/° C. or more.

{Amount of Saponifiable Chloride}

In the production of a soluble imide skeleton resin according to the present invention, a soluble imide skeleton resin produced by a one-step process described below requires the use of epihalohydrin in the reaction. Thus, use of halogen, particularly epichlorohydrin, results in the formation of residual saponifiable chlorine as an end group impurity. The amount of saponifiable chlorine is preferably low. The amount of saponifiable chlorine in a soluble imide skeleton resin is preferably 900 ppm or less, preferably 700 ppm or less. A large amount of saponifiable chlorine, for example, above 1000 ppm unfavorably results in poor electrical characteristics. Although the amount of saponifiable chlorine is preferably small, the amounts of saponifiable chlorine in industrial products are generally 10 ppm or more. The amounts of saponifiable chlorine in certain industrial products may be smaller than 10 ppm, for example, 2 to 4 ppm.

[Method for Producing Soluble Imide Skeleton Resin]

Although a method for producing a soluble imide skeleton resin according to the present invention is not particularly limited, the soluble imide skeleton resin can be produced by the following one- or two-step process.

<One-Step Process>

A method for reacting a divalent phenol compound represented by any of the following general formulae (2-2), (3-2), and (4-2) with epihalohydrin, such as epichlorohydrin or epibromohydrin, in the presence of an alkaline.

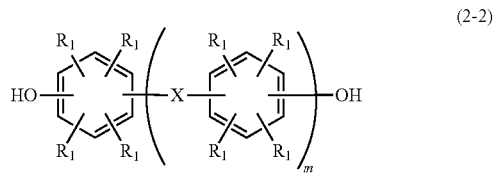

(2-2)

In the formula (2-2), $R_1$, X, and m denote the same as in the general formula (2-1).

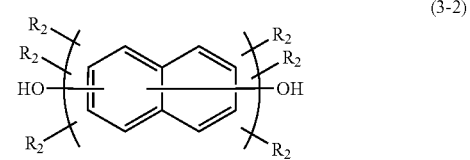

(3-2)

In the formula (3-2), $R_2$ denotes the same as in the general formula (3-1).

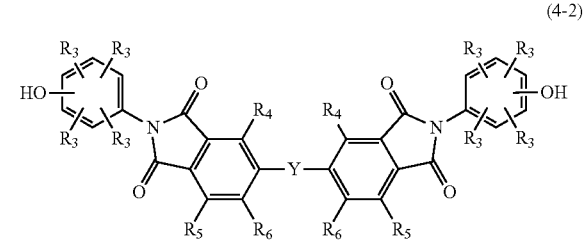

(4-2)

In the formula (4-2), $R_3$, $R_4$, $R_5$, $R_6$, and Y denote the same as in the general formula (4-1).

<Two-Step Process>

A method for reacting a bifunctional epoxy resin represented by any of the following general formulae (7), (8), and (9) with a divalent phenol compound represented by any of the general formulae (2-2), (3-2), and (4-2) in the presence of a catalyst.

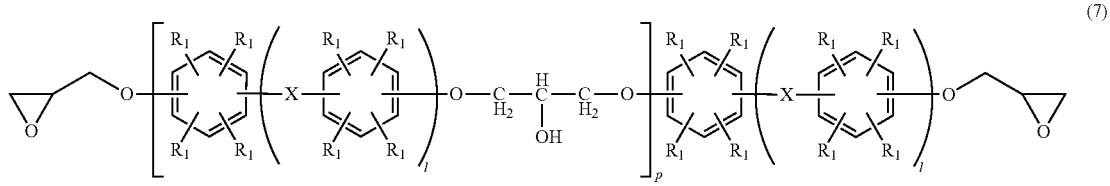

(7)

In the formula (7), $R_1$ and X denote the same as in the general formula (2-1), l is 0 or 1, and p denotes an integer in the range of 0 to 10.

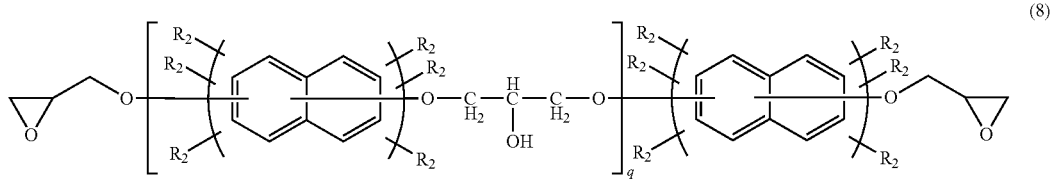

(8)

In the formula (8), $R_2$ denotes the same as in the general formula (3-1), and q denotes an integer in the range of 0 to 10.

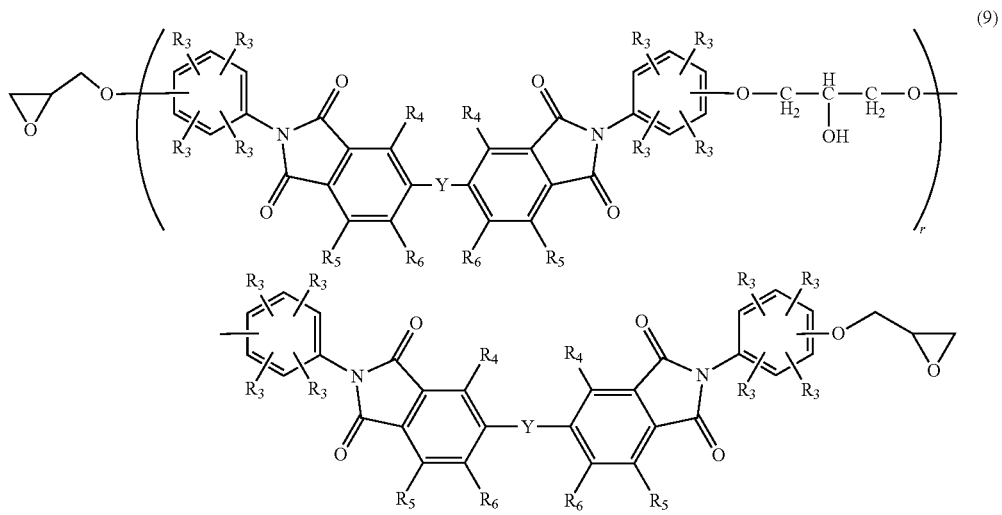

In the formula (9), $R_3$, $R_4$, $R_5$, $R_6$, and Y denote the same as in the general formula (4-1), and r denotes an integer in the range of 0 to 10.

The divalent phenol compounds for use in the production by the one-step process and the two-step process are any of the divalent phenol compounds represented by the general formulae (2-2), (3-2), and (4-2). In the present invention, these may be used alone or in combination. Without compromising the objects of the present invention, a divalent phenol compound, which has two hydroxy groups bonded to an aromatic ring in the molecule, other than these divalent phenol compounds may be used in combination.

Examples of the divalent phenol compounds represented by the general formula (2-2) include bisphenols, such as bisphenol A, bisphenol F, bisphenol S, bisphenol acetophenone, bisphenol fluorenone, bisphenol B, and bisphenol AD, biphenols, such as 4,4'-biphenol and 3,3',5,5'-tetramethyl-4,4'-biphenol, catechol, resorcin, and hydroquinone. Particularly preferred are bisphenol A, bisphenol F, 4,4'-biphenol, 3,3',5,5'-tetramethyl-4,4'-biphenol, bisphenol acetophenone, and bisphenol fluorenone.

Examples of the divalent phenol compounds represented by the general formula (3-2) include dihydroxynaphthalene, dihydroxyanthracene, and dihydroxydihydroanthracene. Particularly preferred are dihydroxynaphthalene and dihydroxydihydroanthracene.

Examples of the divalent phenol compounds represented by the general formula (4-2) preferably include compounds represented by the following general formula (6-2), more preferably compounds represented by the following general formula (10-2), particularly preferably compounds represented by the following structural formulae (10-3), (10-4), (10-5), (10-6), (10-7), and (10-8).

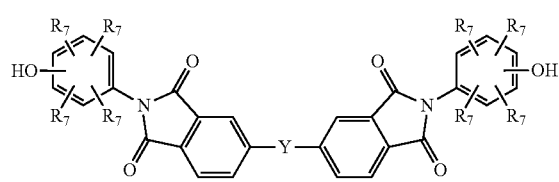

In the formula (6-2), $R_7$ and Y denote the same as in the general formula (6-1).

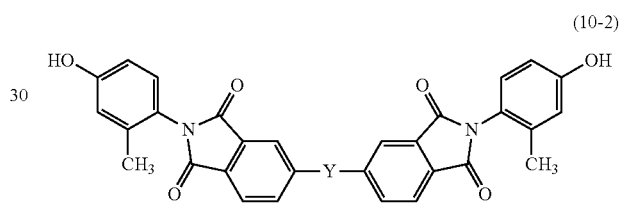

In the formula (10-2), Y preferably denotes a single bond, $-SO_2-$, $-O-$, $-CO-$, or $-C(CF_3)_2-$.

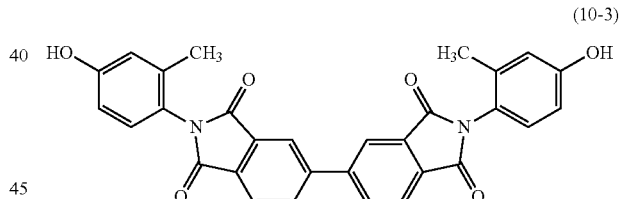

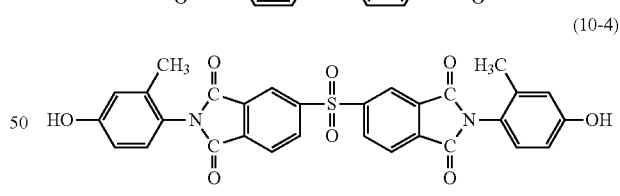

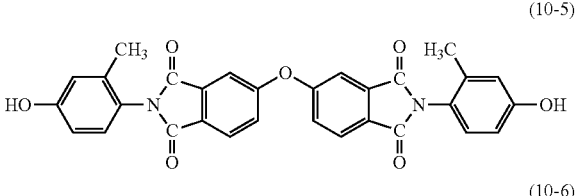

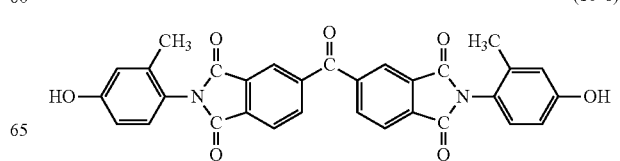

-continued (10-7)

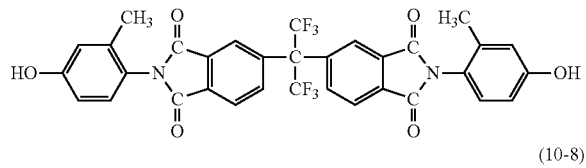

(10-8)

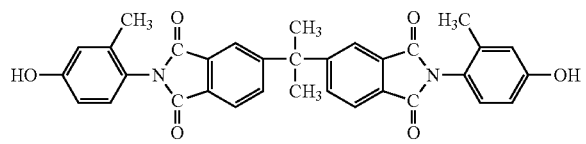

The bifunctional epoxy resin for use in the production by the two-step process is an epoxy resin represented by the general formula (7), (8), or (9). In the present invention, these may be used alone or in combination. Without compromising the objects of the present invention, a bifunctional epoxy resin, which has two epoxy groups in the molecule, other than these bifunctional epoxy resins may be used in combination.

Examples of the bifunctional epoxy resins represented by the general formula (7) include bisphenol epoxy resins, such as bisphenol A epoxy resins, bisphenol F epoxy resins, and bisphenol S epoxy resins, biphenol epoxy resins, bisphenol acetophenone epoxy resins, bisphenol fluorenone epoxy resins, and diglycidyl ethers of monocyclic divalent phenols, such as catechol, resorcin, and hydroquinone. Among these epoxy resins, particularly preferred are bisphenol A epoxy resins, bisphenol F epoxy resins, 4,4'-biphenol epoxy resins, and 3,3',5,5'-tetramethyl-4,4'-biphenol epoxy resins.

Examples of the bifunctional epoxy resins represented by the general formula (8) include dihydroxynaphthalene epoxy resins and dihydroxydihydroanthracene epoxy resins.

Examples of the bifunctional epoxy resins represented by the general formula (9) include imide skeleton epoxy resins.

Examples of the bifunctional epoxy resin that can be used in combination other than the bifunctional epoxy resins represented by the general formulae (7), (8), and (9) include alicyclic epoxy resins, diglycidyl ethers of dihydric alcohols, and diglycidyl esters of divalent carboxylic acids, such as phthalic acid, isophthalic acid, tetrahydrophthalic acid, and hexahydrophthalic acid. These epoxy resins may be substituted with a substituent having no adverse effect, such as an alkyl group, an aryl group, an ether group, or an ester group. These epoxy compounds may be used in combination. Preferably, the amount of these epoxy compounds to be used is 30% by weight or less of the entirety of the bifunctional epoxy resins.

The starting material compounds (or the starting material resins) described above are used in a predetermined ratio such that an imide skeleton resin having the target chemical structure, the target imide skeleton molar content of A, the target number-average molecular weight, and the target solvent solubility can be produced.

The alkaline that can be used in the one-step process is one or two or more selected from sodium hydroxide, potassium hydroxide, and the like and is generally used as an approximately 20% to 50% by weight aqueous solution at a molar ratio in the range of approximately 0.2 to 2.0 relative to the phenol compound.

The catalyst used in the two-step process may be any compound having catalytic activity promoting a reaction between an epoxy group and a phenolic hydroxy group, for example, alkali metal compounds, organophosphorus compounds, tertiary amines, quaternary ammonium salts, cyclic amines, and imidazoles, preferably organophosphorus compound and quaternary ammonium salts.

Specific example of the alkali metal compounds include alkali metal hydroxides, such as sodium hydroxide, lithium hydroxide, and potassium hydroxide; alkali metal salts, such as sodium carbonate, sodium bicarbonate, sodium chloride, lithium chloride, and potassium chloride; alkaline metal alkoxides, such as sodium methoxide and sodium ethoxide; alkali metal phenoxide, sodium hydride, and lithium hydride; and alkali metal salts of organic acids, such as sodium acetate and sodium stearate.

Specific examples of the organophosphorus compound include tri-n-propylphosphine, tri-n-butylphosphine, triphenylphosphine, tetramethylphosphonium bromide, tetramethylphosphonium iodide, tetramethylphosphonium hydroxide, trimethylcyclohexylphosphonium chloride, trimethylcyclohexylphosphonium bromide, trimethylbenzylphosphonium chloride, trimethylbenzylphosphonium bromide, tetraphenylphosphonium bromide, triphenylmethylphosphonium bromide, triphenylmethylphosphonium iodide, triphenylethylphosphonium chloride, triphenylethylphosphonium bromide, triphenylethylphosphonium iodide, triphenylbenzylphosphonium chloride, and triphenylbenzylphosphonium bromide.

Specific examples of the tertiary amine include triethylamine, tri-n-propylamine, tri-n-butylamine, triethanolamine, and benzyldimethylamine.

Specific examples of the quaternary ammonium salts include tetramethylammonium chloride, tetramethylammonium bromide, tetramethylammonium hydroxide, triethylmethylammonium chloride, tetraethylammonium chloride, tetraethylammonium bromide, tetraethylammonium iodide, tetrapropylammonium bromide, tetrapropylammonium hydroxide, tetrabutylammonium chloride, tetrabutylammonium bromide, tetrabutylammonium iodide, benzyltrimethylammonium chloride, benzyltrimethylammonium bromide, benzyltrimethylammonium hydroxide, benzyltributylammonium chloride, and phenyltrimethylammonium chloride.

Specific examples of the cyclic amines include 1,8-diazabicyclo(5,4,0)undecene-7,1,5-diazabicyclo(4,3,0)nonene-5.

Specific examples of the imidazoles include 2-methylimidazole, 2-ethyl-4-methylimidazole, and 2-phenylimidazole.

These catalysts may be used alone or in combination.

Preferably, the amount of these catalysts to be used ranges from 0.001% to 1% by weight of the reactant solid content.

In the one- or two-step process, a solvent may be used in a synthetic reaction process in the production. The solvent may be any solvent that can dissolve the imide skeleton resin without adverse effects on the reaction. Examples of the solvent include aromatic hydrocarbons, aprotic polar solvents, alcohols, ketones, and glycol ethers, preferably aprotic polar solvents, alcohols, ketones, and amide solvents.

Specific examples of the aromatic hydrocarbons include benzene, toluene, and xylene.

Examples of the alcohols include methanol, ethanol, propanol, and butanol.

Examples of the ketones include acetone, methyl ethyl ketone (MEK), methyl isobutyl ketone (MIBK), diisopropyl ketone, di-tert-butyl ketone, 2-heptanone, 4-heptanone, 2-octanone, cyclopentanone, cyclohexanone, cyclohexyl methyl ketone, acetophenone, acetylacetone, and dioxane.

Specific examples of the aprotic polar solvents include dimethyl sulfoxide (DMSO), formamide, N-methylformamide, N,N-dimethylformamide, acetamide, N-methylacetamide, N,N-dimethylacetamide, 2-pyrrolidone, and N-methylpyrrolidone.

Specific examples of the glycol ethers include ethylene glycol monomethyl ether, ethylene glycol monoethyl ether, ethylene glycol mono-n-butyl ether, ethylene glycol dimethyl ether, ethylene glycol monoethyl ether acetate, diethylene glycol monomethyl ether, diethylene glycol monoethyl ether, diethylene glycol mono-n-butyl ether, diethylene glycol dimethyl ether, diethylene glycol monoethyl ether acetate, propylene glycol monomethyl ether, propylene glycol mono-n-butyl ether, and propylene glycol monomethyl ether acetate.

These solvents may be used alone or in combination.

The amount of solvent to be used is appropriately determined in accordance with the reaction conditions. For example, in the production by the two-step process, the amount of solvent to be used is preferably determined such that the solid content ranges from 35% to 95% by weight. In the production by the one-step process, the solvent is preferably used at a molar ratio in the range of approximately 0.2 to 2.0 relative to epihalohydrin. When a viscous product is produced during the reaction, a solvent may be added to continue the reaction. After the completion of the reaction, the solvent may be removed by distillation if necessary or may be further added.

The reaction temperature in the production of a soluble imide skeleton resin according to the present invention by the one-step process ranges from approximately 40° C. to 130° C. The reaction temperature preferably ranges from 40° C. to 80° C., more preferably 45° C. to 70° C.

The reaction time generally ranges from approximately 30 to 240 minutes.

The reaction temperature in the production of a soluble imide skeleton resin according to the present invention by the two-step process is in such a range that the catalyst used is not decomposed. The reaction temperature preferably ranges from 50° C. to 230° C., more preferably 120° C. to 200° C. When a low-boiling solvent, such as acetone or methyl ethyl ketone, is used, the reaction can be performed in an autoclave under high pressure to ensure the reaction temperature.

The reaction time generally ranges from approximately 1 to 12 hours.

[Soluble Imide Skeleton Resin Solution Composition]

A soluble imide skeleton resin according to the present invention has excellent solvent solubility and can consequently be treated as a soluble imide skeleton resin solution composition.

In this case, a solvent used contains 10% by weight or more ketone solvent and/or dimethylacetamide, preferably 20% by weight or more ketone solvent and/or dimethylacetamide, more preferably 30% by weight or more, of the entirety of the solvent components. An excessively small amount of ketone solvent and/or dimethylacetamide in the solvent may result in low solution stability.

The ketone solvent, as used herein, refers to a liquid having a ketone group. Examples of the ketone solvent include acetone, methyl ethyl ketone (MEK), methyl isobutyl ketone (MIBK), diisopropyl ketone, di-tert-butyl ketone, 2-heptanone, 4-heptanone, 2-octanone, cyclopentanone, cyclohexanone, cyclohexyl methyl ketone, acetophenone, acetylacetone, and dioxane. Among these, methyl ethyl ketone (MEK), methyl isobutyl ketone (MIBK), cyclopentanone, and cyclohexanone are preferred, and methyl isobutyl ketone (MIBK) and cyclohexanone are more preferred. These ketone solvents may be used alone or in combination.

The solvent(s) of the soluble imide skeleton resin solution composition other than the ketone solvent and/or dimethylacetamide may be one or two or more of the solvents exemplified as solvents usable in the synthetic reaction process in the method for producing a soluble imide skeleton resin according to the present invention described above.

The content of the soluble imide skeleton resin in the soluble imide skeleton resin solution composition ranges from 1% to 90% by weight, preferably 10% to 90% by weight, more preferably 20% to 80% by weight, still more preferably 25% to 75% by weight. An excessively low content of the soluble imide skeleton resin results in an increase in the amount of solvent used and is uneconomical. An excessively high content of the soluble imide skeleton resin results in an increase in viscosity and poor handling. Furthermore, it is also important that the solution of the soluble imide skeleton resin solution composition should not form a gel (solidification) during long-term storage.

[Curable Resin Composition]

A curable resin composition according to the present invention contains a soluble imide skeleton resin according to the present invention. In addition to a soluble imide skeleton resin according to the present invention, a curable resin composition according to the present invention can further contain an epoxy resin other than the imide skeleton resin, a curing agent, a curing accelerator, a thermosetting resin other than epoxy resins, a solvent, inorganic filler, a fibrous base material, and other various additive components.

<Epoxy Resin Other than Soluble Imide Skeleton Resin>

Examples of the epoxy resin other than a soluble imide skeleton resin that may be contained in a curable resin composition according to the present invention include, but are not limited to, bisphenol A epoxy resins, bisphenol F epoxy resins, bisphenol S epoxy resins, biphenyl epoxy resins, phenol novolak epoxy resins, cresol novolak epoxy resins, bisphenol A novolak epoxy resins, glycidyl ether epoxy resins, such as epoxy resins produced by reacting novolaks from the condensation between phenols and aldehydes, such as glyoxal, hydroxybenzaldehyde, and crotonaldehyde, with epihalohydrin, glycidyl ester epoxy resins, glycidyl amine epoxy resins, linear aliphatic epoxy resins, alicyclic epoxy resins, and heterocyclic epoxy resins. These may be used alone or in combination.

In the case that a curable resin composition according to the present invention contains an epoxy resin other than a soluble imide skeleton resin according to the present invention, the amount of epoxy resin may depend on the application of the curable resin composition and the characteristics required for the curable resin composition and, in general, is preferably 40 parts by weight or less, for example, in the range of 20 to 30 parts by weight, per 100 parts by weight of the entirety of the epoxy resins (the total of the imide skeleton resin and the epoxy resin other than the imide skeleton resin). Blending an epoxy resin other than a soluble imide skeleton resin according to the present invention can produce the effects of improving flexibility and compatibility. An excessively large amount of the epoxy resin, however, may reduce the effects of the heat resistance and the low linear expansivity, particularly the low linear expansivity, of a soluble imide skeleton resin according to the present invention.

<Curing Agent>

In the case that an end group of a soluble imide skeleton resin is an epoxy group, examples of the curing agent for the soluble imide skeleton resin include curing agents for common epoxy resins, for example, polyvalent phenols, such as bisphenol A, bisphenol F, bisphenol AD, hydroquinone, resorcin, methylresorcin, biphenol, tetramethylbiphenol, dihydroxynaphthalene, dihydroxydiphenyl ether, thiodiphenols, phenol novolak resins, cresol novolak resins, phenol aralkyl resins, terpene phenolic resins, dicyclopentadiene phenolic resins, bisphenol A novolak resins, naphthol novolak resins, biphenyl phenolic resins, brominated bisphenol A, and brominated phenol novolak resins, polyvalent phenolic resins produced by condensation reactions between various phenols and various aldehydes, such as benzaldehyde, hydroxybenzaldehyde, crotonaldehyde, and glyoxal, various phenolic resins, such as co-condensation resins between heavy oil or pitch, phenol, and formaldehyde, activated ester compounds produced by the esterification, such as benzoylation or acetylation, of all or part of the phenolic hydroxy groups of the various phenols (phenolic resins), acid anhydrides, such as methyltetrahydrophthalic anhydride, hexahydrophthalic anhydride, pyromellitic dianhydride, and methylnadic anhydride, and amines, such as diethylenetriamine, isophoronediamine, diaminodiphenylmethane, diaminodiphenyl sulfone, dicyandiamide, aliphatic polyamine, and polyamide.

Examples of curing agents that can initiate the polymerization of epoxy groups include phosphine compounds, such as triphenylphosphine, phosphonium salts, such as tetraphenylphosphonium tetraphenylborate, imidazoles, such as 2-methylimidazole, 2-phenylimidazole, 2-ethyl-4-methylimidazole, 2-undecylimidazole, 1-cyanoethyl-2-methylimidazole, and 2,4-dicyano-6-[2-methylimidazolyl-(1)]-ethyl-5-triazine, imidazolium salts, such as 1-cyanoethyl-2-undecylimidazolium trimellitate, 2-methylimidazolium isocyanurate, 2-ethyl-4-methylimidazolium tetraphenylborate, and 2-ethyl-1,4-dimethylimidazolium tetraphenylborate, amines, such as 2,4,6-tris(dimethylaminomethyl)phenol and benzyldimethylamine, ammonium salts, triethylammonium tetraphenylborate, and diazabicyclo compounds, such as 1,5-diazabicyclo(5,4,0)-7-undecene and 1,5-diazabicyclo (4,3,0)-5-nonene. Tetraphenylborates, phenolates, phenol novolak salts, and 2-ethylhexanoates of these diazabicyclo compounds, as well as triflic acid salts, boron trifluoride ether complex compounds, metal fluoroboron complex salts, bis (perfluoroalkylsulfonyl)methane metal salts, aryldiazonium compounds, aromatic onium salts, dicarbonyl chelates of periodic table IIIa to Va group elements, thiopyrylium salts, periodic table VIb group elements in the form of $MF_6^-$ anions (wherein M is selected from phosphorus, antimony, and arsenic), arylsulfonium complex salts, aromatic iodonium complex salts, aromatic sulfonium complex salts, bis[4-(diphenylsulfonio)phenyl]sulfide-bis-hexafluoro metal salts (for example, phosphates, arsenates, antimonates, and the like), arylsulfonium complex salts, and aromatic sulfonium or iodonium salts of halogen-containing complex ions can be used.

Cationic polymerization initiators can also be used as curing agents for epoxy resins. The cationic polymerization initiators may be active energy beam cationic polymerization initiators, which generate cationic species or Lewis acids by an active energy beam latent cationic polymerization initiators, or thermal latent cationic polymerization initiators, which generate cationic species or Lewis acids by heat.

The active energy beam latent cationic polymerization initiators include one or more of metal fluoroboron complex salts and boron trifluoride complex compounds as described in U.S. Pat. No. 3,379,653; bis(perfluoroalkylsulfonyl)methane metal salts as described in U.S. Pat. No. 3,586,616; aryldiazonium compounds as described in U.S. Pat. No. 3,708,296; aromatic onium salts of periodic table VIa group elements as described in U.S. Pat. No. 4,058,400; aromatic onium salts of periodic table Va group elements as described in U.S. Pat. No. 4,069,055; dicarbonyl chelates of periodic table IIIa to Va group elements as described in U.S. Pat. No. 4,068,091; thiopyrylium salts as described in U.S. Pat. No. 4,139,655; periodic table VIb group elements in the form of $MF_6^-$ anions (wherein M is selected from phosphorus, antimony, and arsenic) as described in U.S. Pat. No. 4,161,478; arylsulfonium complex salts as described in U.S. Pat. No. 4,231,951; aromatic iodonium complex salts and aromatic sulfonium complex salts as described in U.S. Pat. No. 4,256,828; and bis[4-(diphenylsulfonio)phenyl]sulfide-bis-hexafluoro metal salts (for example, phosphates, arsenates, antimonates, and the like) as described in W. R. Watt et al., "Journal of Polymer Science, Polymer Chemistry", vol. 22, 1789 (1984). Furthermore, mixed ligand metal salts of iron compounds and silanol-aluminum complexes can also be used.

Preferred active energy beam latent cationic polymerization initiators include arylsulfonium complex salts, aromatic sulfonium or iodonium salts of halogen-containing complex ions, and aromatic onium salts of periodic table II, V, and VI group elements. Some of these salts can be obtained as commercial products: FX-512 (3M Co.), UVR-6990 and UVR-6974 (Union Carbide Co.), UVE-1014 and UVE-1016 (General Electric Co.), KI-85 (Degussa AG), SP-150 and SP-170 (ADEKA Co.), and San-Aid SI-60L, SI-80L, and SI-100L (Sanshin Chemical Industry Co., Ltd.).

Cationic or protonic acid catalysts, such as triflic acid salts, boron trifluoride ether complex compounds, and boron trifluoride, can be used as thermal cationic polymerization initiators. Preferred thermal cationic polymerization initiators are triflic acid salts, such as diethylammonium triflate, which is available from 3M Co. as FC-520, triethylammonium triflate, diisopropylammonium triflate, and ethyldiisopropylammonium triflate (most of these are described in R. R. Alm, Modern Coatings, October, 1980).

Some of aromatic onium salts, which can also be used as active energy beam cationic polymerization initiators, produce cationic species by heat and can also be used as thermal cationic polymerization initiators.

These may be used alone or in combination.

In the case that an end group of a soluble imide skeleton resin according to the present invention is an OH group (that is, B in the general formula (1) is a hydrogen atom), an epoxy resin is preferably used as a curing agent. Examples of the epoxy resin include various polyvalent phenol novolak epoxy resins, such as phenol novolak epoxy resins, cresol novolak epoxy resins, bisphenol A novolak epoxy resins, naphthol novolak epoxy resins, biphenyl phenolic epoxy resins, and brominated phenol novolak epoxy resins.

These may be used alone or in combination.

The amount of curing agent in a curable resin composition depends on the type of the curing agent used and generally ranges from 0.5 to 100 parts by weight, preferably 1 to 95 parts by weight, per 100 parts by weight of the entirety of epoxy resins.

<Curing Accelerator>

The curing accelerator may be any curing accelerator for common epoxy resin compositions, for example, amines, such as benzyldimethylamine and various imidazole compounds, and tertiary phosphines, such as triphenylphosphine. These may be used alone or in combination.

Preferably, 0.1 to 5.0 parts by weight of the curing accelerator per 100 parts by weight of the entirety of epoxy resins is blended.

<Thermosetting Resin Other than Epoxy Resins>

The thermosetting resin other than epoxy resins may be a cyanate ester resin, a thermosetting polyimide resin, or a thermosetting poly(phenylene ether) resin. These may be used alone or in combination.

In the case that a curable resin composition according to the present invention contains such a thermosetting resin, the amount of thermosetting resin is preferably 40 parts by weight or less, for example, 10 to 30 parts by weight, per 100 parts by weight of the entirety of epoxy resins. A curable resin composition containing a thermosetting resin other than epoxy resins can have low water absorbency. An excessively large amount of thermosetting resin, however, may compromise the advantageous effects of using a soluble imide skeleton resin according to the present invention and even the characteristics of epoxy resins.

<Solvent>

Solvents that can be contained in a curable resin composition according to the present invention may be the solvents for use in a soluble imide skeleton resin solution composition, for example, ketones, such as acetone, methyl ethyl ketone, methyl isobutyl ketone, cyclopentanone, and cyclohexanone, aromatics, such as toluene and xylene, esters, such as ethyl acetate, ethers, such as ethylene glycol monomethyl ether, amides, such as N,N-dimethylformamide and N,N-dimethylacetamide, and alcohols, such as methanol and ethanol. In order to achieve excellent formability, ketone solvents having high solubility are preferred.

These solvents may be used alone or in combination.

The amount of solvent to be used is appropriately determined in accordance with the intended use of a curable resin composition. For laminate applications, in the formation of a prepreg by the impregnation of a glass fiber nonwoven fabric with a curable resin composition, the total solids of the curable resin composition except the solvent(s) range from approximately 40% to 70% by weight. For built-up applications, the total solids of the curable resin composition except the solvent(s) range from approximately 35% to 75% by weight.

<Inorganic Filler>

Examples of the inorganic filler include metal oxides, such as aluminum oxide and magnesium oxide, silicon compounds, such as fine-powdered silica, fused silica, and crystalline silica, transparent filler, such as glass beads, and metal hydroxides, such as aluminum hydroxide and magnesium hydroxide, as well as calcium carbonate, kaolin, mica, a quartz powder, graphite, and molybdenum disulfide. These may be used alone or in combination.

Inorganic filler having an excessively large particle size causes deterioration in the surface profile of a cured product. Inorganic filler having an excessively small particle size tends to aggregate, causing deterioration in dispersibility. Thus, inorganic filler preferably has an average particle size in the range of approximately 1 to 30 μm.

In the case that a curable resin composition according to the present invention contains such inorganic filler, the amount of inorganic filler is preferably 80 parts by weight or less, for example, 10 to 60 parts by weight, per 100 parts by weight of the entirety of epoxy resins. Inclusion of inorganic filler in a curable resin composition has the effects of improving flame resistance, lowering water absorbency, and lowering the coefficient of linear expansion. However, an excessively large amount of inorganic filler may cause deterioration in formability.

<Resin Base Material>

Examples of the resin base material include inorganic fiber cloths, such as glass fiber cloths, glass fiber nonwoven fabrics, and organic fiber nonwoven fabrics. These may be used alone or in combination.

A curable resin composition containing such a fibrous base material can be formed by various methods, for example, the coating or impregnation of the fibrous base material with the curable resin composition. The fibrous base material content can be altered with the method.

<Other Components>

A curable resin composition according to the present invention can be blended with various additives that can be blended with common epoxy resin compositions, such as an ultraviolet absorber for improving storage stability, a plasticizer, a coupling agent, such as a silane coupling agent or a titanate coupling agent, a colorant or a pigment, a halogen, phosphorus, nitrogen, or silicon flame retardant for providing flame resistance, and a reinforcing material, such as a glass fiber, without compromising the objects of the present invention.

A curable resin composition according to the present invention can be prepared by mixing predetermined amounts of the components described above.

[Applications]

A curable resin composition containing a soluble imide skeleton resin according to the present invention can be effectively utilized in various fields, such as adhesives, paints, civil engineering and construction materials, and insulating materials for electrical and electronic components. In particular, because of its high heat resistance, low linear expansivity, and processability, a curable resin composition containing a soluble imide skeleton resin according to the present invention can be suitably used in multilayer electrical laminates and printed wiring boards of a new system, such as a build-up process. In particular, a curable resin composition containing a soluble imide skeleton resin according to the present invention is preferably used in the form of resin-coated copper foil or an adhesive film used as a multilayer printed wiring board material of a build-up process. Furthermore, a curable resin composition containing a soluble imide skeleton resin according to the present invention can be used in flexible laminate applications, resist materials, and sealing materials.

A soluble imide skeleton resin according to the present invention may be modified with acrylic acid, methacrylic acid, or the like.

As illustrated in FIG. 1, in the build-up process, films (insulating layers) each having a thickness in the range of 40 to 90 μm or copper-foil-laminated films 3 in which a copper foil 2A (the copper foil thickness: 9 to 18 μm) is disposed on a film 2 are stacked on an inner-layer circuit board (a core substrate; 1A denotes a circuit) 1, in which glass prepregs are stacked. In general, the build-up process involves this laminating press step and other two steps, that is, a boring (laser or drilling) step and a desmear/plating step, thus forming a circuit. Laminates manufactured by the build-up process have the same performance as conventional laminates and the mounting area and the weight equal to an approximately quarter of those of the conventional laminates. Thus, the build-up process can reduce the size and the weight of the laminates.

A curable resin composition containing a soluble imide skeleton resin according to the present invention is useful as a resin material for a copper-foil-laminated film or a film used in the build-up process.

[Cured Resin]

A cured resin according to the present invention is formed by curing a curable resin composition according to the present invention.

A method for curing a curable resin composition according to the present invention depends on the components to be blended and their amounts in the curable resin composition and generally involves heating conditions of 100° C. to 200° C. for 60 to 180 minutes. In order to reduce incomplete curing, heating preferably involves two stages: first heating at 100° C. to 130° C. for 10 to 30 minutes and second heating at 150° C. to 200° C., which is 50° C. to 80° C. higher than the first heating temperature, for 60 to 150 minutes.

[Laminated Product]

A laminated product according to the present invention is a laminated product of a cured resin according to the present invention formed by curing a curable resin composition according to the present invention and a conducting metal and is preferably a conducting-metallic-foil-laminated film serving as a build-up layer for use in the build-up process.

Conducting metallic foil of the electroconductive-conducting-foil-laminated film may be metallic foil of copper, aluminum, or the like and generally has a thickness in the range of approximately 9 to 19 μm. The film generally has a thickness in the range of approximately 40 to 90 μm.

As described in the examples described below, the laminated product can be manufactured by preparing a coating solution having an appropriate viscosity from a curable resin composition according to the present invention using a solvent, applying the coating solution to metallic foil, such as copper foil, and semi-curing the curable resin composition under the first heating conditions described above. A required number of the laminated products the resin side of which is semi-cured can be stacked on the core substrate 1, as illustrated in FIG. 1, and can be completely cured and integrated at a pressure in the range of 2 to 5 MPa under the second heating conditions described above, thereby forming a printed wiring board.

EXAMPLES

Although the present invention is further described in the following examples and comparative examples, the present invention is not limited to these examples without departing from the gist of the present invention.

Example 1

A 2-L three-neck flask equipped with a thermometer, a stirrer, and a condenser was charged with 45 g of an imide skeleton phenol compound represented by the structural formula (10-3), 149 g of bisphenol A, 620 g of epichlorohydrin, 241 g of 2-propanol, and 90 g of water and was heated to 50° C. to dissolve the mixture. 141 g of 48.5% by weight aqueous sodium hydroxide was added dropwise to the mixture over one hour. During the dropping, the flask was gradually heated. When the dropping was completed, the temperature in the system reached 70° C. The temperature was then held at 70° C. for 30 minutes to continue a reaction. After the completion of the reaction, the product was washed with water to remove a by-product salt and excessive sodium hydroxide. Excessive epichlorohydrin and 2-propanol were then evaporated from the product under reduced pressure to yield a crude epoxy resin.

The crude epoxy resin was dissolved in 410 g of methyl isobutyl ketone, to which 7 g of 48.5% by weight aqueous sodium hydroxide was then added. The mixture was allowed to react at a temperature of 70° C. for one hour. After the completion of the reaction, sodium dihydrogen phosphate was added to neutralize excessive sodium hydroxide, and the product was washed with water to remove a by-product salt. Methyl isobutyl ketone was then completely removed during heating under reduced pressure, thus yielding a target soluble imide skeleton epoxy resin (I).

Example 2

A 2-L three-neck flask equipped with a thermometer, a stirrer, and a condenser was charged with 75 g of an imide skeleton phenol compound represented by the structural formula (10-4), 120 g of bisphenol A, 550 g of epichlorohydrin, 241 g of 2-propanol, and 80 g of water and was heated to 50° C. to dissolve the mixture. 125 g of 48.5% by weight aqueous sodium hydroxide was added dropwise to the mixture over one hour. During the dropping, the flask was gradually heated. When the dropping was completed, the temperature in the system reached 70° C. The temperature was then held at 70° C. for 30 minutes to continue a reaction. After the completion of the reaction, the product was washed with water to remove a by-product salt and excessive sodium hydroxide. Excessive epichlorohydrin and 2-propanol were then evaporated from the product under reduced pressure to yield a crude epoxy resin.

The crude epoxy resin was dissolved in 400 g of methyl isobutyl ketone, to which 7 g of 48.5% by weight aqueous sodium hydroxide was then added. The mixture was allowed to react at a temperature of 70° C. for one hour. After the completion of the reaction, sodium dihydrogen phosphate was added to neutralize excessive sodium hydroxide, and the product was washed with water to remove a by-product salt. Methyl isobutyl ketone was then completely removed during heating under reduced pressure, thus yielding a target soluble imide skeleton epoxy resin (II).

Example 3

A 2-L three-neck flask equipped with a thermometer, a stirrer, and a condenser was charged with 20 g of an imide skeleton phenol compound represented by the structural formula (10-5), 167 g of bisphenol A, 640 g of epichlorohydrin, 250 g of 2-propanol, and 90 g of water and was heated to 50° C. to dissolve the mixture. 146 g of 48.5% by weight aqueous sodium hydroxide was added dropwise to the mixture over one hour. During the dropping, the flask was gradually heated. When the dropping was completed, the temperature in the system reached 70° C. The temperature was then held at 70° C. for 30 minutes to continue a reaction. After the completion of the reaction, the product was washed with water to remove a by-product salt and excessive sodium hydroxide. Excessive epichlorohydrin and 2-propanol were then evaporated from the product under reduced pressure to yield a crude epoxy resin.

The crude epoxy resin was dissolved in 410 g of methyl isobutyl ketone, to which 7 g of 48.5% by weight aqueous sodium hydroxide was then added. The mixture was allowed to react at a temperature of 70° C. for one hour. After the completion of the reaction, sodium dihydrogen phosphate was added to neutralize excessive sodium hydroxide, and the product was washed with water to remove a by-product salt. Methyl isobutyl ketone was then completely removed during heating under reduced pressure, thus yielding a target soluble imide skeleton epoxy resin (III).

Example 4

A 2-L three-neck flask equipped with a thermometer, a stirrer, and a condenser was charged with 40 g of an imide skeleton phenol compound represented by the structural formula (10-6), 154 g of bisphenol A, 417 g of epichlorohydrin, 163 g of 2-propanol, and 62 g of water and was heated to 50° C. to dissolve the mixture. 143 g of 48.5% by weight aqueous sodium hydroxide was added dropwise to the mixture over one hour. During the dropping, the flask was gradually heated. When the dropping was completed, the temperature in the system reached 70° C. The temperature was then held at 70° C. for 30 minutes to continue a reaction. After the completion of the reaction, the product was washed with water to remove a by-product salt and excessive sodium hydroxide. Excessive epichlorohydrin and 2-propanol were then evaporated from the product under reduced pressure to yield a crude epoxy resin.

The crude epoxy resin was dissolved in 420 g of methyl isobutyl ketone, to which 7 g of 48.5% by weight aqueous sodium hydroxide was then added. The mixture was allowed to react at a temperature of 70° C. for one hour. After the completion of the reaction, sodium dihydrogen phosphate was added to neutralize excessive sodium hydroxide, and the product was washed with water to remove a by-product salt. Methyl isobutyl ketone was then completely removed during heating under reduced pressure, thus yielding a target soluble imide skeleton epoxy resin (IV).

Example 5

A 2-L three-neck flask equipped with a thermometer, a stirrer, and a condenser was charged with 200 g of an imide skeleton phenol compound represented by the structural formula (10-7), 254 g of epichlorohydrin, 100 g of 2-propanol, and 40 g of water and was heated to 50° C. to dissolve the mixture. 58 g of 48.5% by weight aqueous sodium hydroxide was added dropwise to the mixture over one hour. During the dropping, the flask was gradually heated. When the dropping was completed, the temperature in the system reached 70° C. The temperature was then held at 70° C. for 30 minutes to continue a reaction. After the completion of the reaction, the product was washed with water to remove a by-product salt and excessive sodium hydroxide. Excessive epichlorohydrin and 2-propanol were then evaporated from the product under reduced pressure to yield a crude epoxy resin.

The crude epoxy resin was dissolved in 351 g of methyl isobutyl ketone, to which 6 g of 48.5% by weight aqueous sodium hydroxide was then added. The mixture was allowed to react at a temperature of 70° C. for one hour. After the completion of the reaction, sodium dihydrogen phosphate was added to neutralize excessive sodium hydroxide, and the product was washed with water to remove a by-product salt. Methyl isobutyl ketone was then completely removed during heating under reduced pressure, thus yielding a target soluble imide skeleton epoxy resin (V).

The structures, the physical properties, and other properties of the imide skeleton resins (I), (II), (III), (IV), and (V) were examined by the following methods. The results are shown in Tables 2 and 3.

<Chemical Structure, Imide Skeleton Molar Content of A>

The chemical structure and the imide skeleton molar content of A were calculated from the proportions of the raw materials charged. The n values and the mean value thereof were calculated from the number-average molecular weight measured by the following method.

<Number-Average Molecular Weight>

A calibration curve was prepared with an HLC-8120 GPC apparatus manufactured by Tosoh Co. using TSK Standard Polystyrene F-128 (Mw 1,090,000, Mn 1,030,000), F-10 (Mw 106,000, Mn 103,000), F-4 (Mw 43,000, Mn 42,700), F-2 (Mw 17,200, Mn 16,900), A-5000 (Mw 6,400, Mn 6,100), A-2500 (Mw 2,800, Mn 2,700), and A-300 (Mw 453, Mn 387) as standard polystyrenes. The number-average molecular weight was measured as a polystyrene equivalent molecular weight. Column: TSKGEL Super HM-H+ H5000+H4000+H3000+H2000 manufactured by Tosoh Co. Eluent: THF. Flow rate: 0.6 ml/min. Detection: UV (254 nm). Temperature: 40° C. Sample concentration: 0.1%. Injection amount: 10 μl.

<Epoxy Equivalent>

The epoxy equivalent was measured in accordance with JIS K 7236 and was shown in terms of solid content.

<Amount of Saponifiable Chlorine>

The amount of saponifiable chlorine was measured in accordance with JIS K 7242-2 and was expressed in terms of solid content.

<Glass Transition Temperature and Coefficient of Linear Expansion of Particular Cured Product>

Preparation of Particular Cured Product

A particular cured product was prepared by the following curing method II.

A soluble imide skeleton resin, a curing agent jER Cure YLH129 (trade name of Japan Epoxy Resins Co., Ltd., a bisphenol A novolak resin, hydroxyl equivalent 117 (g/eq.), softening point 115 (° C.)), and a curing accelerator 2-ethyl-4-methylimidazole in the amounts described below in Table 1 were placed in a 200-ml beaker, were heated on a hot plate at 260° C., and were melt-blended. After the melt-blended resin was degassed under reduced pressure, the resin was heated in a Safeven dryer at 170° C. for 30 minutes and then 200° C. for 90 minutes to produce a particular cured product.

The glass transition temperature and the mean coefficient of linear expansion of the particular cured product were examined by the following method.

<Glass Transition Temperature>

The glass transition temperature (Tg) was measured with a 2010 DSC thermal analysis system manufactured by TA Instruments while the temperature was raised from 20° C. to 300° C. at 10° C./min.

<Coefficient of Linear Expansion>

The mean coefficient of linear expansion was measured with a TMA/SS6100 apparatus manufactured by SII NanoTechnology Inc. in a compression mode at a temperature in the range of 30° C. to 130° C. while the temperature was increased from 20° C. to 250° C. at 5° C./min.

<Solubility>

The solubility at 60° C. was visually observed using cyclohexanone (manufactured by Wako Pure Chemical Industries, Ltd., grade S, purity 99% or more) as a solvent in accordance with the method for measuring solubility described above.

Comparative Example 1

A crude epoxy resin was produced in the same manner as in Example 1 except that a 2-L three-neck flask was charged with 188 g of bisphenol F, 385 g of epichlorohydrin, and 149 g of 2-propanol as starting materials. The crude epoxy resin was purified in the same manner as in Example 1 to produce a target epoxy resin (VI).

Comparative Example 2

A 2-L three-neck flask equipped with a thermometer, a stirrer, and a condenser was charged with 200 g of an imide skeleton phenol compound represented by the following structural formula (11), 290 g of epichlorohydrin, 100 g of 2-propanol, and 40 g of water and was heated to 50° C. The mixture was not dissolved. Thus, 100 g of N-methylpyrrolidone was added, and the flask was heated to 50° C. to dissolve the mixture. 55 g of 48.5% by weight aqueous sodium hydroxide was added dropwise over one hour. During the dropping, the flask was gradually heated. When the dropping was completed, the temperature in the system reached 70° C. The temperature was then held at 70° C. for 30 minutes to continue a reaction. After the completion of the reaction, the product was washed with water to remove a by-product salt and excessive sodium hydroxide. Excessive epichlorohydrin and 2-propanol were then evaporated from the product under reduced pressure to yield a crude epoxy resin solution (containing N-methylpyrrolidone).

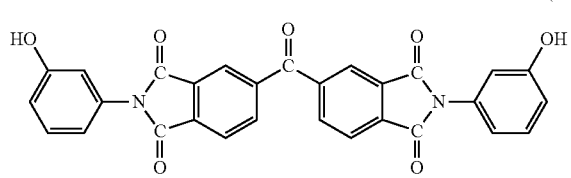

(11)

200 g of N-methylpyrrolidone and 6 g of 48.5% by weight aqueous sodium hydroxide were added to the crude epoxy resin solution. The mixture was allowed to react at a temperature of 70° C. for one hour. After the completion of the reaction, sodium dihydrogen phosphate was added to neutralize excessive sodium hydroxide, and the product was washed with water to remove a by-product salt. N-methylpyrrolidone was then completely removed during heating under reduced pressure, thus yielding an imide skeleton epoxy resin (VII).

Table 3 shows the structure, the physical properties, and other properties of the epoxy resin (VI) and the imide skeleton epoxy resin (VII) measured and evaluated in the same manner as in Example 1.

TABLE 1

| | Amount (g) | | |
|---|---|---|---|
| | Resin | Curing agent | Curing accelerator |
| Soluble imide skeleton resin (I) | 100 | 58.5 | 0.3 |
| Soluble imide skeleton resin (II) | 100 | 50.9 | 0.3 |
| Soluble imide skeleton resin (III) | 100 | 59.1 | 0.3 |
| Soluble imide skeleton resin (IV) | 100 | 40.3 | 0.3 |
| Soluble imide skeleton resin (V) | 100 | 28.7 | 0.3 |
| Epoxy resin (VI) | 100 | 69.2 | 0.3 |
| Imide skeleton resin (VII) | 100 | 30.8 | 0.3 |

TABLE 3

| | | Example 5 | Comparative example 1 | Comparative example 2 |
|---|---|---|---|---|
| Resin | | Soluble imide skeleton resin (V) | Epoxy resin (VI) | Imide skeleton resin (VII) |
| Chemical structure of general formula (1) | A | Formula (10-1) (Y = —C(CF$_3$)$_2$) | Formula (2-5) | Formula (11) |
| | B | Formula (5) | Formula (5) | Formula (5) |
| | n | 0-4, average 0.11 | 0-4, average 0.09 | 0-5, average 0.24 |
| Epoxy equivalent weight | | 408 g/eq. | 169 g/eq. | 380 g/eq. |
| Saponifiable chlorine | | 560 ppm | 550 ppm | 950 ppm |
| Imide skeleton molar content of A | | 100% by mol | 0% by mol | 100% by mol |
| Cyclohexanone solubility | | 40% by weight | 40% by weight | <1.0% by weight |
| Glass transition temperature of particular cured product | | 178° C. | 98° C. | 169° C. |
| Mean linear expansion coefficient of particular cured product | | 55 ppm/° C. | 86 ppm/° C. | 63 ppm/° C. |

Examples 6 to 10 and Comparative Examples 3 and 4

A compound (X), a compound (Y), a catalyst, and a solvent in amounts described in Tables 4 and 5 were placed in a pressure-resistant reaction vessel equipped with a stirrer and were allowed to react in a nitrogen gas atmosphere at 180° C. for five hours to produce an imide skeleton resin solution composition. In order to analyze the properties of the resulting resin, a solvent was removed from the imide skeleton resin solution composition by a routine method, and the properties of the resulting resin were analyzed by the following method. Tables 4 and 5 show the results.

<Number-Average Molecular Weight>

A calibration curve was prepared with an HLC-8120 GPC apparatus manufactured by Tosoh Co. using TSK Standard Polystyrene F-128 (Mw 1,090,000, Mn 1,030,000), F-10 (Mw 106,000, Mn 103,000), F-4 (Mw 43,000, Mn 42,700), F-2 (Mw 17,200, Mn 16,900), A-5000 (Mw 6,400, Mn 6,100), A-2500 (Mw 2,800, Mn 2,700), and A-300 (Mw 453, Mn 387) as standard polystyrenes. The number-average

TABLE 2

| | | Example 1 | Example 2 | Example 3 | Example 4 |
|---|---|---|---|---|---|
| Resin | | Soluble imide skeleton resin (I) | Soluble imide skeleton resin (II) | Soluble imide skeleton resin (III) | Soluble imide skeleton resin (IV) |
| Chemical structure of general formula (1) | A | Formula (10-1) (Y = single bond) + Formula (2-4) | Formula (10-1) (Y = —SO$_2$—) + Formula (2-4) | Formula (10-1) (Y = —O—) + Formula (2-4) | Formula (10-1) (Y = —CO—) + Formula (2-4) |
| | B | Formula (5) | Formula (5) | Formula (5) | Formula (5) |
| | n | 0-4, average 0.08 | 0-4, average 0.09 | 0-4, average 0.08 | 0-5, average 0.20 |
| Epoxy equivalent weight | | 200 g/eq. | 230 g/eq. | 198 g/eq. | 290 g/eq. |
| Saponifiable chlorine | | 450 ppm | 440 ppm | 430 ppm | 500 ppm |
| Imide skeleton molar content of A | | 12% by mol | 20% by mol | 5% by mol | 10% by mol |
| Cyclohexanone solubility | | 40% by weight | 40% by weight | 40% by weight | 40% by weight |
| Glass transition temperature of particular cured product | | 150° C. | 151° C. | 143° C. | 146° C. |
| Mean linear expansion coefficient of particular cured product | | 66 ppm/° C. | 65 ppm/° C. | 69 ppm/° C. | 67 ppm/° C. | molecular weight was measured as a polystyrene equivalent molecular weight. Column: TSKGEL Super HM-H+ H5000+H4000+H3000+H2000 manufactured by Tosoh Co. Eluent: THF. Flow rate: 0.6 ml/min. Detection: UV (254 nm). Temperature: 40° C. Sample concentration: 0.1%. Injection amount: 10 μl.

Figure 2:
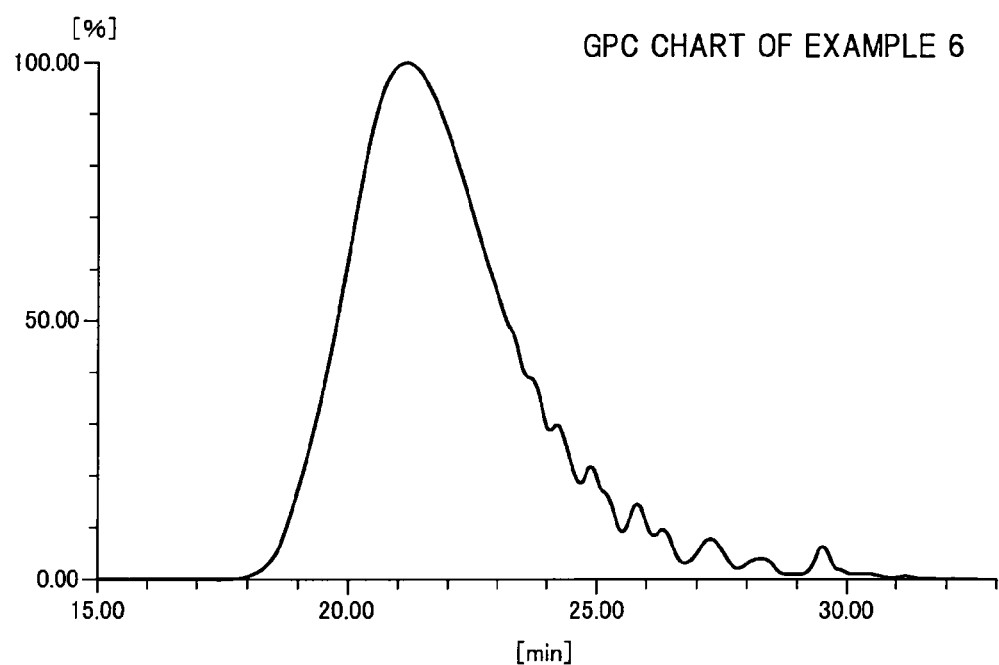
FIG. 2 is a GPC chart of a soluble imide skeleton resin according to Example 6.

FIG. 2 shows a GPC chart of a resin according to Example 6.

<Imide Skeleton Molar Content of A>

The imide skeleton molar content of A was calculated from the proportions of the raw materials charged.

<n>

The n values and the mean value thereof in the general formula (1) were calculated from the number-average molecular weight.

<Epoxy Equivalent>

The epoxy equivalent weight was measured in accordance with JIS K 7236 and was shown in terms of solid content.

<Amount of Saponifiable Chlorine>

The amount of saponifiable chlorine was measured in accordance with JIS K 7242-2 and was shown in terms of solid content.

<Infrared Analysis>

Figure 3:
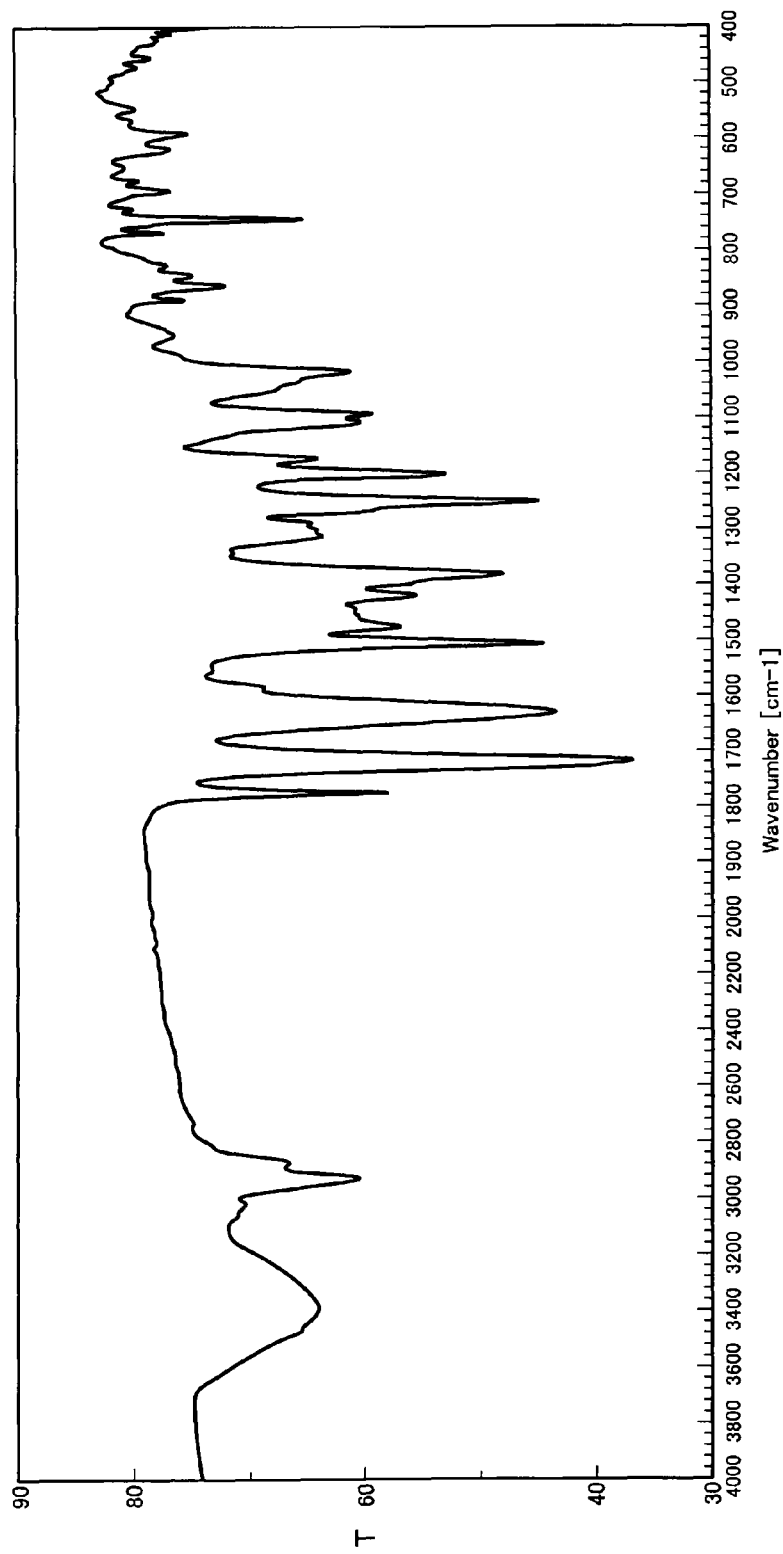
FIG. 3 is an IR chart of a soluble imide skeleton resin according to Example 6.

The IR measurement of the resin according to Example 6 was performed with FT/1R-460 Plus manufactured by JAS.CO JASCO Co. FIG. 3 shows the IR chart.

<Glass Transition Temperature and Coefficient of Linear Expansion of Particular Cured Product>

Preparation of Particular Cured Product

A particular cured product was prepared by the following curing method I.

100 g (solid) of an imide skeleton resin, 5 g of a curing agent jER 157S70 (trade name of Japan Epoxy Resins Co., Ltd., a bisphenol A novolak epoxy resin, the epoxy equivalent 210 (g/eq.)), 2 g of jER Cure YLH129 (trade name of Japan Epoxy Resins Co., Ltd., a bisphenol A novolak resin, the hydroxyl equivalent 117 (g/eq.), the softening point 115 (° C.)), 0.5 g of a curing accelerator 2-ethyl-4-methylimidazole, 80 g of cyclohexane, and 80 g of dimethylacetamide were mixed in a 1000-ml beaker. A coating film was formed with an applicator having a slit width of 300 μm on a Teflon film (Nichias Co., Teflon tape TOMBO9001) and was held in a hot-air dryer at 170° C. for 30 minutes and at 200° C. for 90 minutes, forming a particular cured product having a thickness in the range of 60 to 100 μm.

Measurement of Glass Transition Temperature and Coefficient of Linear Expansion

The glass transition temperature and the coefficient of linear expansion (a mean value in the range of 30° C. to 130° C.) of the resulting particular cured product were measured by the following method.

Figure 4:
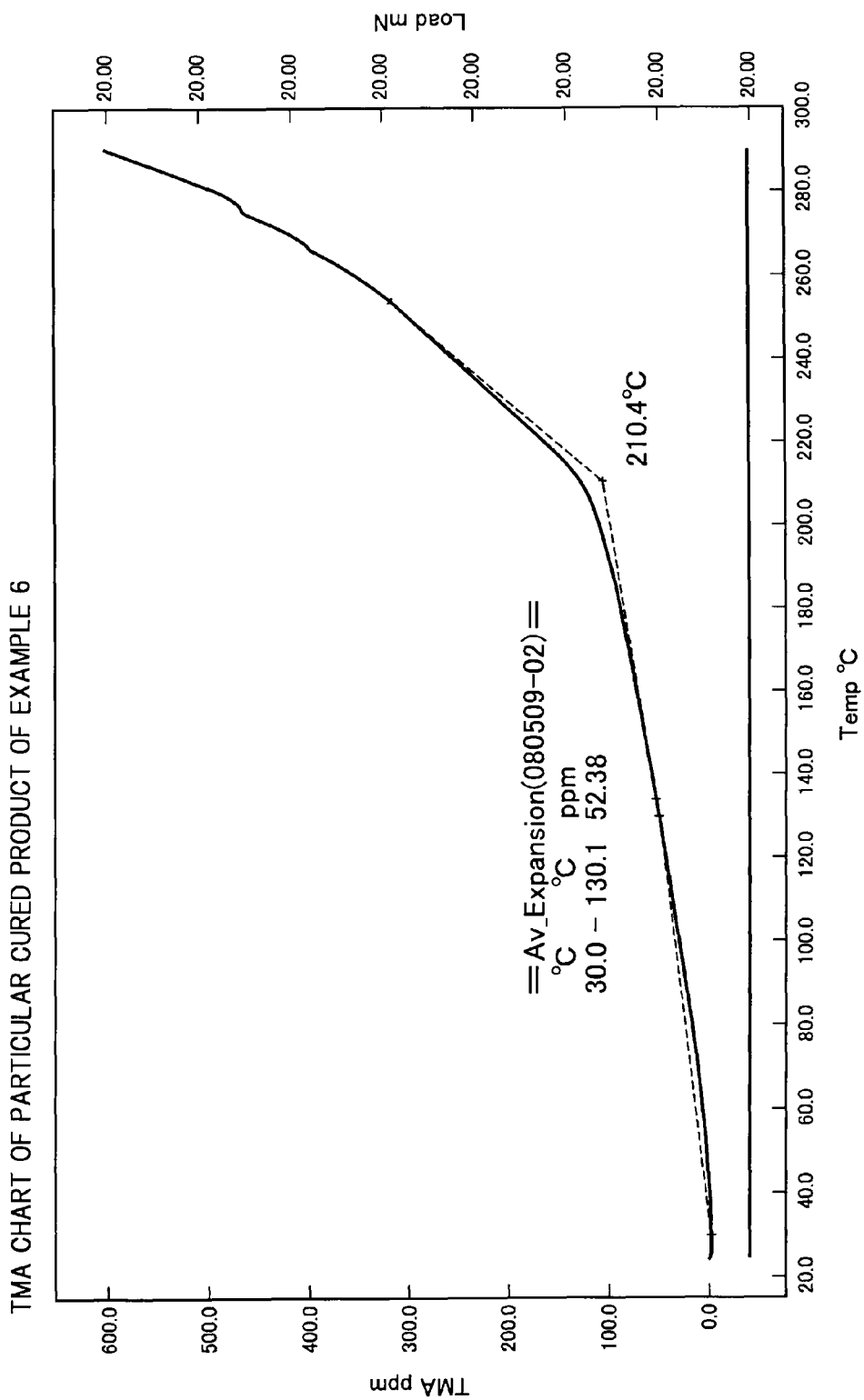
FIG. 4 is a TMA chart of a particular cured product of a soluble imide skeleton resin according to Example 6.

The mean coefficient of linear expansion at a temperature in the range of 30° C. to 130° C. and the glass transition temperature were measured with a TMA/SS6100 apparatus manufactured by SII NanoTechnology Inc. in a film tensile mode while the temperature was increased from 20° C. to 250° C. at 5° C./min. FIG. 4 shows a TMA chart of the particular cured product according to Example 6.

In Tables 4 and 5, a to p represent the following.

a: jER YX4000 (trade name of Japan Epoxy Resins Co., Ltd., a tetramethylbiphenol epoxy resin, epoxy equivalent weight 186 g/eq., saponifiable chlorine concentration 40 ppm)

b: jER 828 (trade name of Japan Epoxy Resins Co., Ltd., a bisphenol A epoxy resin, epoxy equivalent weight 186 g/eq., saponifiable chlorine concentration 40 ppm)

c: jER YX8800 (trade name of Japan Epoxy Resins Co., Ltd., a dihydroxyanthracene epoxy resin, epoxy equivalent weight 178 g/eq., saponifiable chlorine concentration 38 ppm)

d: HP4032 (trade name of Dainippon Ink and Chemicals, Inc., a 1,6-dihydroxynaphthalene epoxy resin, epoxy equivalent weight 142 g/eq.)

e: an imide skeleton phenol compound represented by the structural formula (10-3) (phenolic hydroxyl equivalent weight 252 g/eq.)

f: an imide skeleton phenol compound represented by the structural formula (10-4) (phenolic hydroxyl equivalent weight 284 g/eq.)

g: an imide skeleton phenol compound represented by the structural formula (10-5) (phenolic hydroxyl equivalent weight 260 g/eq.)

h: an imide skeleton phenol compound represented by the structural formula (10-6) (phenolic hydroxyl equivalent weight 266 g/eq.)

i: an imide skeleton phenol compound represented by the structural formula (10-7) (phenolic hydroxyl equivalent weight 328 g/eq.)

j: an imide skeleton phenol compound represented by the structural formula (11) (phenolic hydroxyl equivalent weight 252 g/eq.)

k: bisphenol A (phenolic hydroxyl equivalent weight 114 g/eq.)

l: cyclohexanone m: N,N-dimethylacetamide n: dimethylformamide

O: 50% by weight tetramethylammonium chloride aqueous solution (nitrogen content 6.39%)

p: 29% by weight tetramethylammonium hydroxide aqueous solution (nitrogen content 4.46%)

TABLE 4

|  |  | Example 6 | Example 7 | | Example 8 | | Example 9 | |
|---|---|---|---|---|---|---|---|---|
| Raw materials (parts by weight) | Compound (X) | a (100) | a (50) | b (50) | a (50) | c (48) | a (50) | d (36) |
|  | Compound (Y) | e (130.3) | f (47) | k (38) | g (133.1) | | h (141.0) | |
|  | Solvent | l (268) | m (268) | l (427) | | l (693) | | l (259) | m (259) |
|  | Catalyst | p (0.80) | o (0.36) | | p (0.83) | | o (0.80) | |
| Chemical structure of general formula (1) | A | Formula (2-3) + Formula (10-1) (Y = single bond) | Formula (2-3) + Formula (2-4) + Formula (10-1) (Y = —SO$_2$—) | | Formula (2-3) + Formula (3-3) + Formula (10-1) (Y = —O—) | | Formula (2-3) + Formula (3-4) + Formula (10-1) (Y = —CO—) | |
|  | B | Formula (5) | Formula (5) | | Formula (5) | | Hydrogen atom | |
|  | n (average) | 0~30(13.0) | 0~12(3.8) | | 0~31(13.3) | | 0~71(23.7) | |

TABLE 4-continued

|  |  | Example 6 | Example 7 | Example 8 | Example 9 |
|---|---|---|---|---|---|
| Analysis results of imide skeleton resin | Number-average molecular weight | 11560 | 4900 | 11930 | 21310 |
|  | Epoxy equivalent weight (g/eq.) | 13600 | 5100 | 9000 | 101000 |
|  | Imide skeleton molar content of A (% by mol) | 49.0 | 16.0 | 48.9 | 50.5 |
|  | Saponifiable chlorine (ppm) | 640 | 600 | 710 | 590 |
|  | Glass transition temperature (° C.) | 192 | 146 | 190 | 172 |
|  | Cyclohexanone solubility (% by weight) | 30 | 30 | 30 | 30 |
| Glass transition temperature of particular cured product (° C.) |  | 210 | 150 | 201 | 176 |
| Linear expansion coefficient of particular cured product (ppm/° C.) |  | 52 | 68 | 59 | 56 |

TABLE 5

|  |  | Example 10 | Comparative example 3 | Comparative example 4 |
|---|---|---|---|---|
| Raw materials (parts by weight) | Compound (X) | a (100) | b (100) | a (100) |
|  | Compound (Y) | i (173.0) | e (10.0)   k (53.0) | j (132.0) |
|  | Solvent | l (637) | l (190)   m (190) | n (541) |
|  | Catalyst | p (0.98) | p (0.75) | p (0.80) |
| Chemical structure of general formula (1) | A | Formula (2-3) + Formula (10-1) (Y = —C(CF$_3$)$_2$—) | Formula (2-4) + Formula (10-1) (Y = single bond) | Formula (2-3) + Formula (11) |
|  | B | Formula (5) | Formula (5) | Formula (5) |
|  | n (average) | 0~200(70.0) | 0~40(18.1) | 0~30(12.9) |
| Analysis results of imide skeleton resin | Number-average molecular weight | 71000 | 11245 | 10040 |
|  | Epoxy equivalent weight (g/eq.) | 57000 | 9800 | 9020 |
|  | Imide skeleton molar content of A (% by mol) | 49.8 | 4.3 | 48.8 |
|  | Saponifiable chlorine (ppm) | 650 | 900 | 870 |
|  | Glass transition temperature (° C.) | 175 | 99 | 171 |
|  | Cyclohexanone solubility (% by weight) | 30 | 30 | <1.0 |
| Glass transition temperature of particular cured product (° C.) |  | 180 | 106 | 175 |
| Linear expansion coefficient of particular cured product (ppm/° C.) |  | 50 | 87 | 60 |

These results show that a soluble imide skeleton resin according to the present invention has high heat resistance and a low coefficient of linear expansion.

Examples 11 to 17 and Comparative Example 5

The imide skeleton resins prepared in Example 1, Examples 5 to 10, and Comparative Example 4 were dissolved in cyclohexanone, methyl ethyl ketone, dimethylacetamide, and dimethylformamide at the proportions described in Table 6 to prepare brown transparent imide skeleton resin solution compositions.

These imide skeleton resin solution compositions were placed in sample bottles and were stored in a circulating hot-air oven at a constant temperature of 40° C. for 30 days. After 30 days, the gelation or solidification of the imide skeleton resin solution compositions was visually inspected while shaking the sample bottles by hand. Table 6 shows the results.

TABLE 6

| Type of imide skeleton resin | | Example | | | | | | | Comparative example 5 |
|---|---|---|---|---|---|---|---|---|---|
| | | 11 Resin of Example 1 | 12 Resin of Example 5 | 13 Resin of Example 6 | 14 Resin of Example 7 | 15 Resin of Example 8 | 16 Resin of Example 9 | 17 Resin of Example 10 | Resin of Comparative example 4 |
| Resin content and solvent content of imide skeleton resin solution composition (% by weight) | Imide skeleton resin | 75 | 50 | 30 | 30 | 25 | 30 | 30 | 30 |
| | Cyclohexanone | 15 | 30 | 35 | 70 | 75 | 35 | 70 | — |
| | Methyl ethyl ketone | 5 | — | — | — | — | — | — | — |
| | Dimethylacetamide | 5 | 20 | 35 | — | — | 35 | — | — |
| | Dimethylformamide | — | — | — | — | — | — | — | 70 |
| Gelation after storage at 40° C. for 30 days | | No gelation | No gelation | No gelation | No gelation | No gelation | No gelation | No gelation | Gelation |

These results show that a soluble imide skeleton resin solution composition according to the present invention has excellent storage stability.

Examples 18 to 23 and Comparative Example 6

Varnishes were prepared in accordance with the formulations described in Table 7 using the imide skeleton resins prepared in Example 1, Examples 6 to 10, and Comparative Example 3 and commercial epoxy resins. A coating film was formed on copper foil (F3-WS) with a 300 μm applicator and was placed in a hot-air dryer at 170° C. for 30 minutes and then at 200° C. for 90 minutes, yielding a copper-foil-laminated cured resin having a thickness in the range of 60 to 100 μm.

At the same time, varnishes having the formulations described in Table 7 were applied to copper foil (F3-WS) with a 300 gm applicator to form coating films, which were placed in a hot-air dryer at 170° C. for 30 minutes, forming copper-foil-laminated B-stage semi-cured resins. Two copper-foil-laminated B-stage semi-cured resins were stacked and were held in a hot press at 200° C. and a pressure of 2.9 MPa for 90 minutes to form a laminated product.

The commercial epoxy resins, the curing agents, and the copper foil used are described below.

jER YX4000: trade name of Japan Epoxy Resins Co., Ltd., a tetramethylbiphenyl epoxy resin, epoxy equivalent weight 186 (g/eq.)

jER 157S70: trade name of Japan Epoxy Resins Co., Ltd., a bisphenol A novolak epoxy resin, epoxy equivalent weight 210 (g/eq.)

jER Cure YLH129: trade name of Japan Epoxy Resins Co., Ltd., a bisphenol A novolak resin, hydroxyl equivalent weight 117 (g/eq.), softening point 115 (° C.)

B103: trade name of Nippon Light Metal Co., Ltd., aluminum hydroxide, average particle size 8 μm AroCy B-30: trade name of Huntsman International LLC., a bisphenol A dicyanate resin F3-WS: trade name of Furukawa Circuit Foil Co., Ltd., electrolytic copper foil, thickness 18 μm The physical properties of the copper-foil-laminated cured resins thus prepared were measured by the following methods. The copper foil peel strength was measured with a laminated product. The other physical properties were measured with cured resin alone, prepared by removing the copper foil from the copper-foil-laminated cured resin. Table 7 shows the results.

<Coefficient of Linear Expansion and Glass Transition Temperature>

The mean coefficient of linear expansion at a temperature in the range of 30° C. to 130° C. and the glass transition temperature were measured with a TMA/SS6100 apparatus manufactured by SII NanoTechnology Inc. in a film tensile mode while the temperature was increased from 20° C. to 250° C. at 5° C./min.

<Water Absorption Rate>

The water absorption rate of a film was measured under measurement conditions of 85° C./85% RH/168 hours with an EHS-211MD apparatus manufactured by ESPEC Corp.

<Copper Foil Peel Strength>

The copper foil peel strength was measured in accordance with JIS C6481.

TABLE 7

| | | | Example | | | | | | Comparative example |
|---|---|---|---|---|---|---|---|---|---|
| | | | 18 | 19 | 20 | 21 | 22 | 23 | 6 |
| Formulation of curable resin composition (parts by weight) | Curable resin (solids) | Imide skeleton resin of Example 1 | 63 | | | | | | |
| | | Imide skeleton resin of Example 6 | 45 | 40 | | | | | |
| | | Imide skeleton resin of Example 7 | | | 100 | | | | |
| | | Imide skeleton resin of Example 8 | | | | 100 | | | |

TABLE 7-continued

|  |  |  | Example | | | | | | Comparative example |
|---|---|---|---|---|---|---|---|---|---|
|  |  |  | 18 | 19 | 20 | 21 | 22 | 23 | 6 |
|  |  | Imide skeleton resin of Example 9 |  |  |  |  | 80 |  |  |
|  |  | Imide skeleton resin of Example 10 |  |  |  |  |  | 100 |  |
|  |  | Imide skeleton resin of Comparative example 3 |  |  |  |  |  |  | 100 |
|  |  | Commercial epoxy resin (jER YX4000) |  | 50 | 4 |  |  | 3 | 10 |
|  |  | Commercial epoxy resin (jER 157S70) |  | 5 | 10 | 6 | 8 | 4 | 5 |
| Epoxy resin curing agent |  | jER Cure YLH129 | 37 | 34.6 | 10.4 | 2 | 2 | 4.3 | 10.3 |
| Curing accelerator |  | 2-ethyl-4-methylimidazole | 0.9 | 0.7 | 0.7 | 0.7 | 0.9 | 0.7 | 0.7 |
| Solvent |  | Cyclohexanone | 30 | 30 | 30 | 30 | 30 | 30 | 30 |
|  |  | Methyl cellosolve | 5 | 5 | 5 | 5 | 5 | 5 | 5 |
|  |  | N,N-dimethylacetamide | 30 | 30 | 30 | 30 | 30 | 30 | 30 |
| Inorganic filler (aluminum hydroxide) |  | B103 |  |  |  | 10 |  |  |  |
| Thermosetting resin |  | AroCy B-30 |  |  |  |  | 15 |  |  |
| Curing physical properties | Glass transition temperature (° C.) |  | 175 | 167 | 155 | 209 | 188 | 187 | 110 |
|  | Mean linear expansion coefficient at 30° C. to 130° C. (ppm/° C.) |  | 69 | 74 | 70 | 59 | 58 | 53 | 88 |
|  | Water absorption rate (%) |  | 0.99 | 1.12 | 0.98 | 0.96 | 0.95 | 0.90 | 1.21 |
|  | Copper foil peel strength (kN/m) |  | 1.0 | 1.1 | 1.4 | 1.2 | 1.1 | 1.0 | 0.9 |

Table 7 shows that the cured films formed of the soluble imide skeleton resins according to the present invention have a low coefficient of linear expansion and high heat resistance (glass transition temperature).

Although the present invention has been described in detail with reference to particular embodiments, it is apparent to a person skilled in the art that various modifications can be made without departing from the spirit and scope of the present invention.

The present application is based on Japanese Patent Application (Japanese Patent Application No. 2008-233543) filed on Sep. 11, 2008 and Japanese Patent Application (Japanese Patent Application No. 2009-182613) filed on Aug. 5, 2009, which are incorporated herein by reference in their entirety.

The invention claimed is:

1. A curable resin composition, comprising:

a soluble imide skeleton resin;

a curing agent; and a curing accelerator, wherein the soluble imide skeleton resin has a solubility of 1% by weight or more in cyclohexanone at 60° C., the soluble imide skeleton resin has a structure of formula (1):

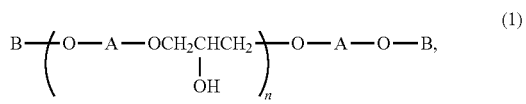

wherein

A is a linking group of formula (2-1), (3-1), or (10-1), each A is the same or different, provided that 5% by mole or more of all A groups are a linking group having an imide skeleton of formula (10-1), B is a group of formula (5):

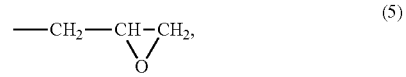

and n is an integer of from 1 to 200,

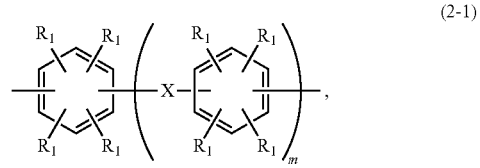

wherein $R_1$ is a hydrogen atom, a hydrocarbon group containing from 1 to 10 carbon atoms, or a halogen element, $R_1$ groups are the same or different, and two $R_1$ groups bonded to adjacent carbon atoms on a benzene ring are optionally bound together to form a cyclic group containing from 4 to 20 carbon atoms and the cyclic group is optionally at least one aromatic ring;

m is 0 or 1, and

X is a single bond, a divalent hydrocarbon group containing from 1 to 20 carbon atoms, —O—, —S—, —SO$_2$—, or —CO—,

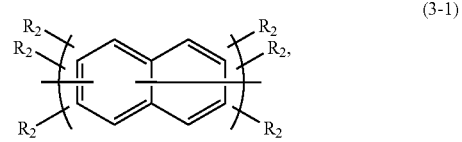

wherein $R_2$ is a hydrogen atom, a hydrocarbon group containing from 1 to 10 carbon atoms, or a halogen element, $R_2$ groups are the same or different, and two $R_2$ groups bonded to adjacent carbon atoms on the naphthalene ring are optionally bound together to form a cyclic group containing from 4 to 20 carbon atoms and the cyclic group is optionally at least one aromatic ring; and

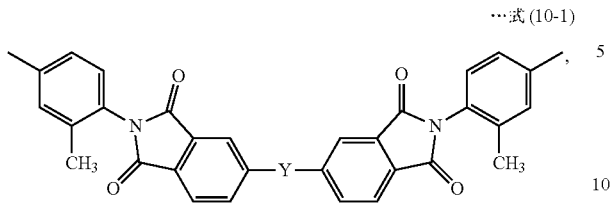

wherein

Y is selected from the group consisting of a single bond, —SO$_2$—, —O—, —C(CF$_3$)$_2$—, —S—, and a divalent hydrocarbon group containing from 1 to 20 carbon atoms.

2. The composition of claim 1, wherein a cured product formed by the soluble imide skeleton resin, being blended only with a curing agent and a curing accelerator, has a glass transition temperature of 130° C. or more and a coefficient of linear expansion at the glass transition temperature or less, of less than 75 ppm/° C.

3. A method for producing the composition of claim 1, the method comprising:

reacting at least one divalent phenol compound selected from the group consisting of formula (2-2), a compound of formula (3-2), and a compound of formula (10-2) with epihalohydrin in the presence of an alkaline:

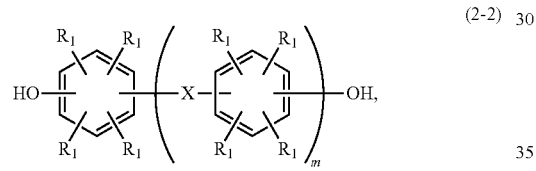

wherein R$_1$, X, and m are as in formula (2-1);

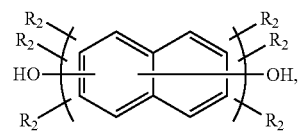

wherein R$_2$ is as in formula (3-1);

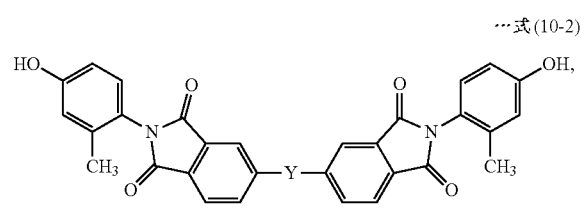

wherein Y is as in formula (10-1)

thereby obtaining the soluble imide resin skeleton, then mixing the soluble imide resin skeleton with the curing agent and the curing accelerator, thereby obtaining the curable resin composition.

4. A method for producing the composition of claim 1, the method comprising:

reacting at least one bifunctional epoxy resin selected from the group consisting of a compound of formula (7), a compound of formula (8), and a compound of formula (9), with at least one divalent phenol compound selected from the group consisting of a compound of formula (2-2), a compound of formula (3-2), and a compound of formula (10-2) in the presence of at least one catalyst:

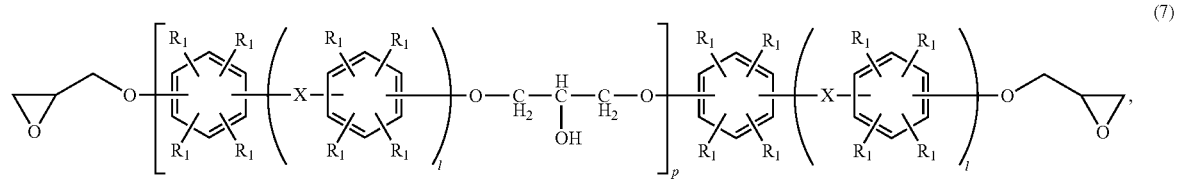

wherein
R$_1$ and X are as in formula (2-1),
l is 0 or 1, and
p is an integer of from 0 to 10;

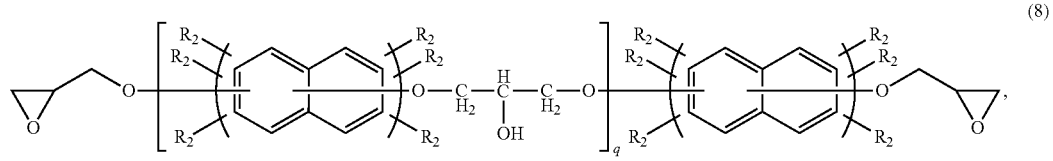

wherein
R$_2$ is as in formula (3-1), and
q is an integer of from 0 to 10;

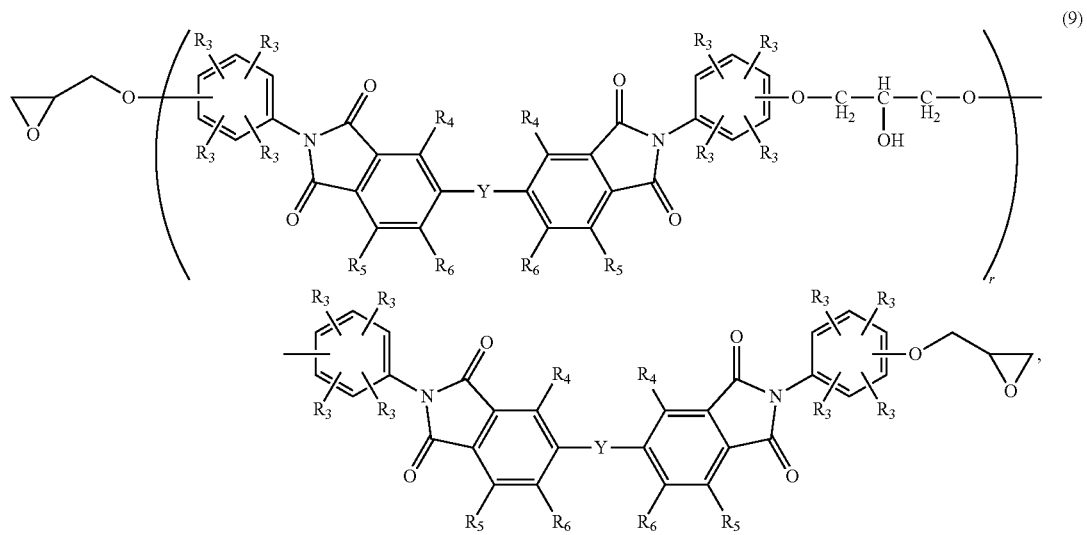

wherein
each $R_3$ is a hydrogen atom or a methyl group,
$R_4$, $R_5$, and $R_6$ are hydrogen atoms,
Y is as in formula (10-1), and
r is an integer of from 0 to 10;

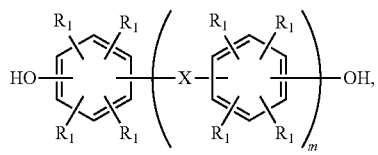

wherein $R_1$, X, and m are as in formula (2-1);

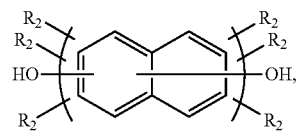

wherein $R_2$ is as in formula (3-1);

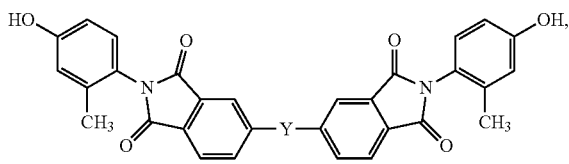

wherein Y is as in formula (10-1)
thereby obtaining the soluble imide resin skeleton,
then mixing the soluble imide resin skeleton with the curing agent and the curing accelerator, thereby obtaining the curable resin composition.

5. The composition of claim 1, comprising:
   1% to 90% by weight of the soluble imide skeleton resin dissolved in a solvent comprising at least one selected from the group consisting of a ketone solvent and dimethylacetamide,
   wherein the at least one selected from the group consisting of the ketone solvent and dimethylacetamide account for 10% by weight or more of all solvent components.

6. The curable resin composition of claim 1, further comprising:
   at least one selected from the group consisting of an epoxy resin other than the soluble imide skeleton resin, a thermosetting resin other than epoxy resin, and an inorganic filler.

7. The curable resin composition of claim 1, wherein the curable resin composition is suitable for a printed wiring board.

8. A method of obtaining a cured resin, the method comprising curing the curable resin composition of claim 1.

9. A method of obtaining a laminated product, the method comprising:
   preparing a coating solution from the curable resin composition of claim 1 and a solvent,
   applying the coating solution to metallic foil comprising an electroconductive metal, and
   curing the curable resin composition, thereby obtaining the laminated product,
   wherein the laminated product comprises:
   the cured resin, and
   the electroconductive metal.

10. The composition of claim 1, wherein at least one A group is a group of formula (2-1) or of formula (3-1).

11. The composition of claim 1, wherein m is 0.

* * * * *